United States Patent
Kim et al.

(10) Patent No.: US 9,911,828 B2
(45) Date of Patent: Mar. 6, 2018

(54) METHODS OF FABRICATING A SEMICONDUCTOR DEVICE

(71) Applicant: Samsung Electronics Co., Ltd., Suwon-si (KR)

(72) Inventors: Kyungsoo Kim, Hwaseong-si (KR); Yeon ho Park, Seoul-si (KR); Wookhyun Kwon, Yongin-si (KR); Nakjin Son, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 14/967,455

(22) Filed: Dec. 14, 2015

(65) Prior Publication Data

US 2016/0225633 A1  Aug. 4, 2016

(30) Foreign Application Priority Data

Jan. 29, 2015  (KR) .................. 10-2015-0014438

(51) Int. Cl.
*H01L 21/336* (2006.01)
*H01L 29/66* (2006.01)
*H01L 21/308* (2006.01)

(52) U.S. Cl.
CPC .... *H01L 29/66795* (2013.01); *H01L 21/3086* (2013.01)

(58) Field of Classification Search
CPC ..................... H01L 29/66795; H01L 21/3086
USPC ........................................................ 438/283
See application file for complete search history.

(56) References Cited

U.S. PATENT DOCUMENTS

| | | | |
|---|---|---|---|
| 7,807,575 B2 | 10/2010 | Zhou | |
| 8,198,157 B2 | 6/2012 | Sel et al. | |
| 8,227,354 B2 | 7/2012 | Kim et al. | |
| 8,466,066 B2 | 6/2013 | Kim | |
| 8,593,001 B2 | 11/2013 | Hopkins | |
| 8,629,052 B2 | 1/2014 | Park et al. | |
| 8,836,083 B2 | 9/2014 | Zhou | |
| 8,846,541 B2 | 9/2014 | Min et al. | |
| 8,921,034 B2 | 12/2014 | Hopkins | |
| 2008/0203482 A1* | 8/2008 | Han | H01L 29/1033 257/365 |
| 2014/0273464 A1 | 9/2014 | Shieh et al. | |
| 2014/0295654 A1 | 10/2014 | Hsieh et al. | |
| 2016/0365440 A1* | 12/2016 | Suk | H01L 29/785 |

* cited by examiner

*Primary Examiner* — Jami M Valentine
(74) *Attorney, Agent, or Firm* — Ward and Smith, P.A.

(57) ABSTRACT

Provided are methods of fabricating a semiconductor device including a field effect transistor. Such methods may include sequentially forming lower and intermediate mold layers on a substrate, forming first upper mold patterns and first spacers on the first and second regions, respectively, of the substrate, etching the intermediate mold layer using the first upper mold patterns and the first spacers as an etch mask to form first and second intermediate mold patterns, respectively, forming second spacers to cover sidewalls of the first and second intermediate mold patterns, etching the lower mold layer using the second spacers as an etch mask to form lower mold patterns, and etching the substrate using the lower mold patterns as an etch mask to form active patterns.

20 Claims, 29 Drawing Sheets

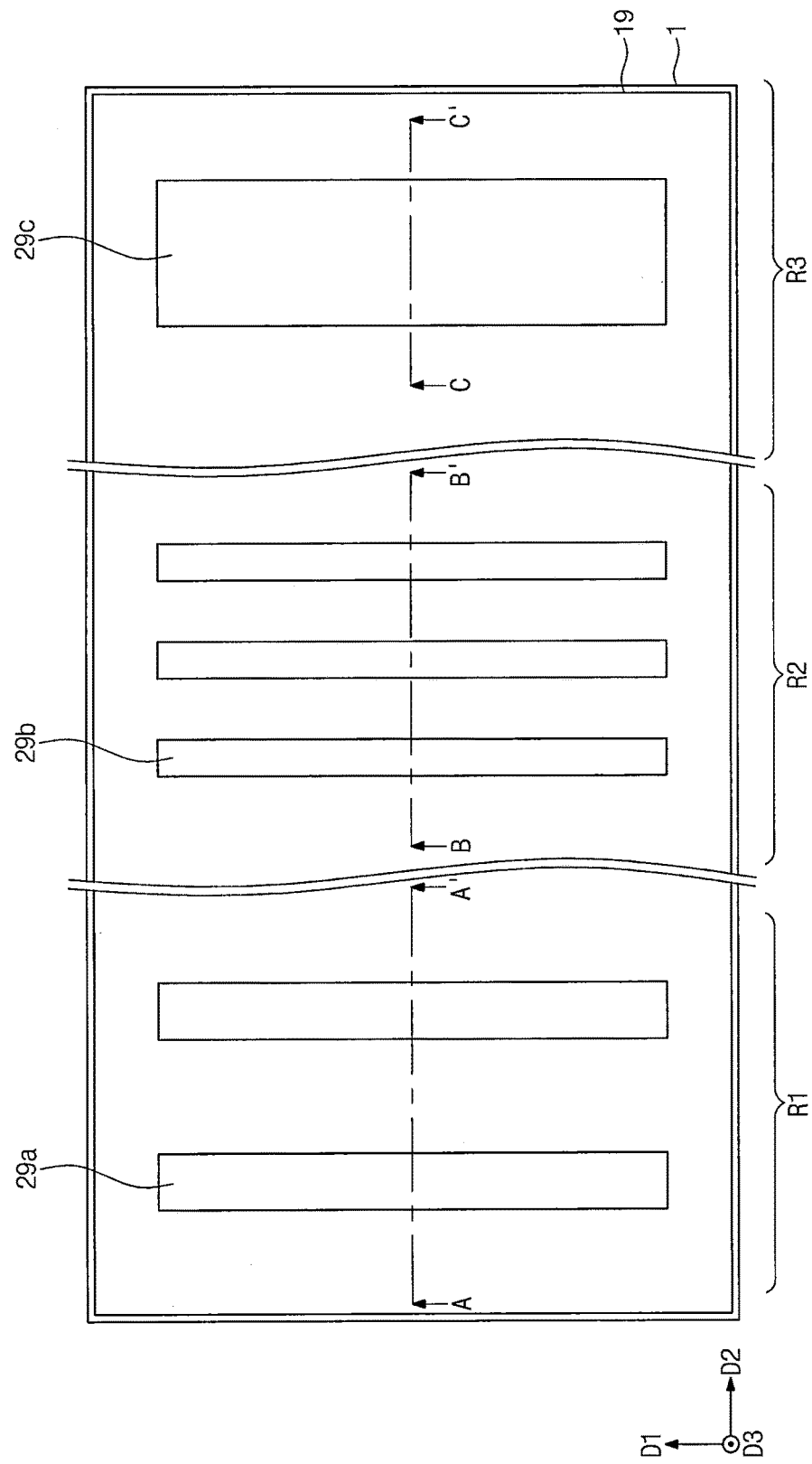

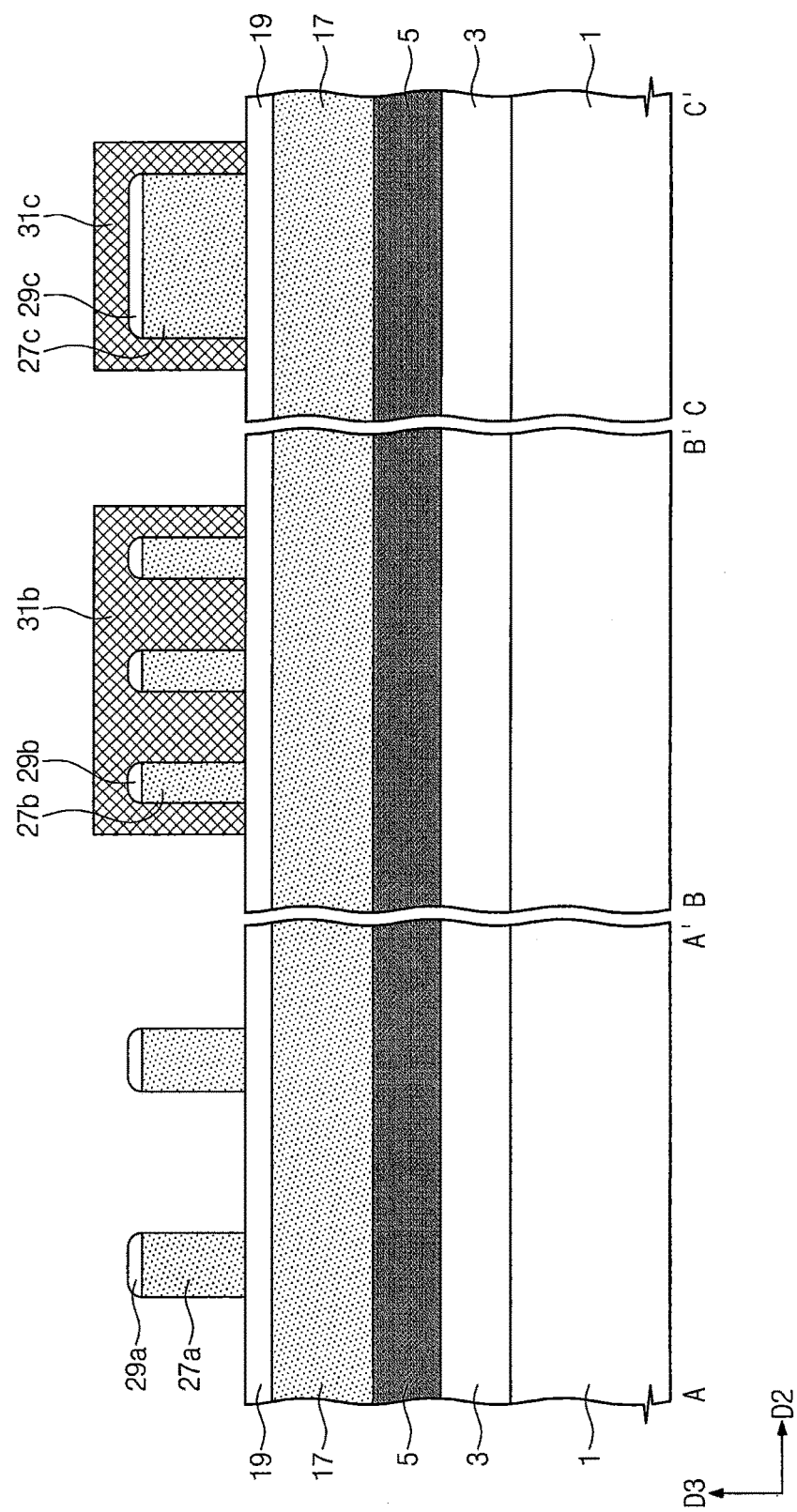

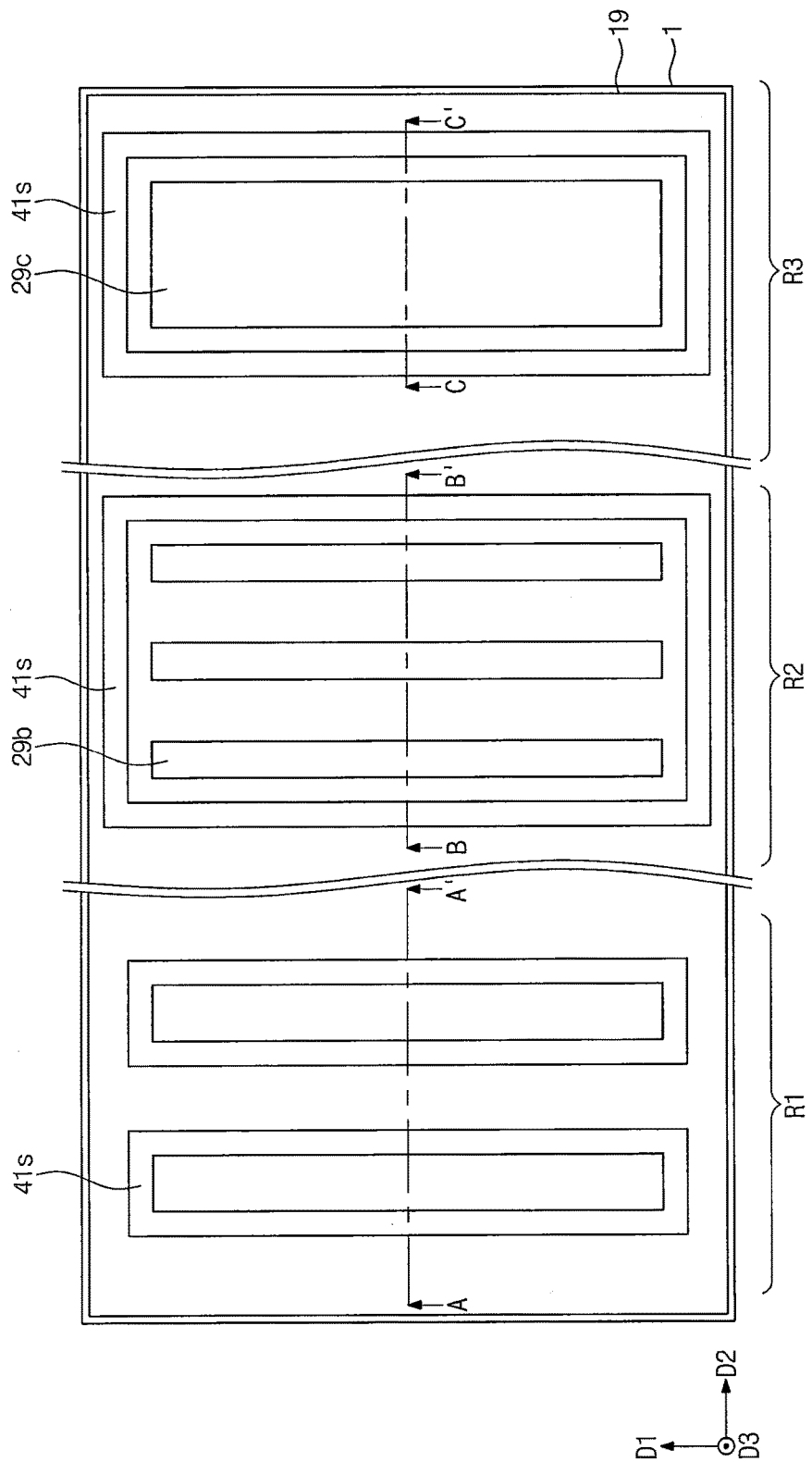

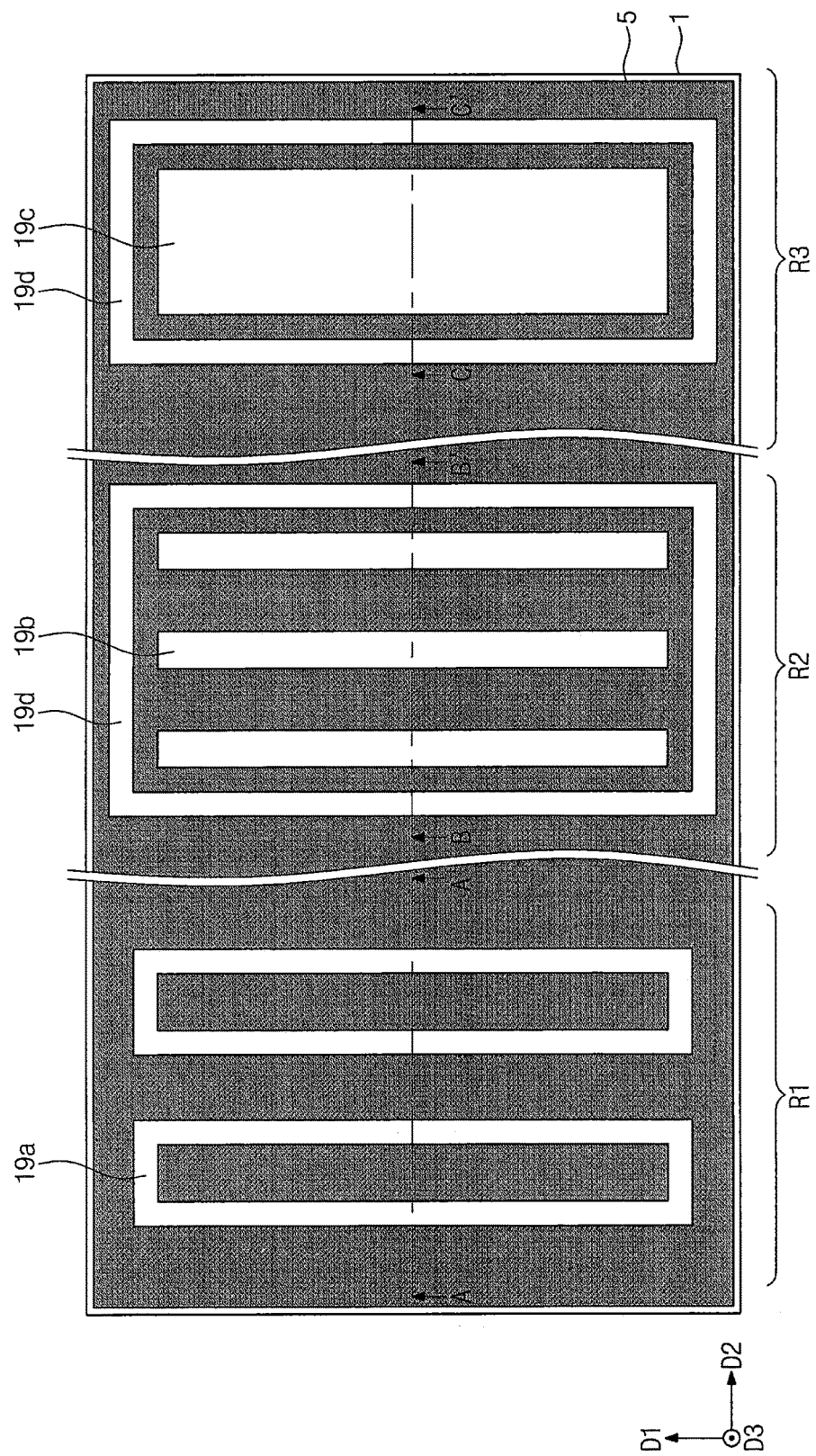

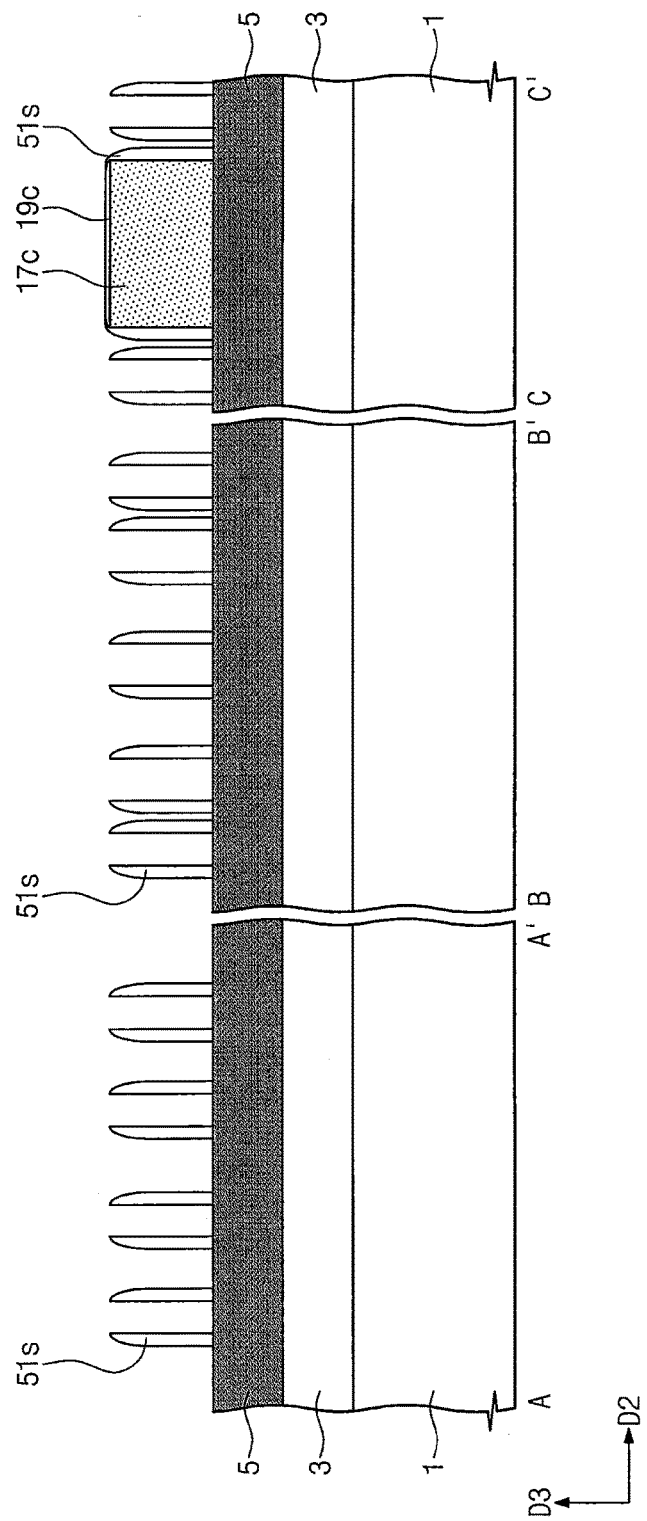

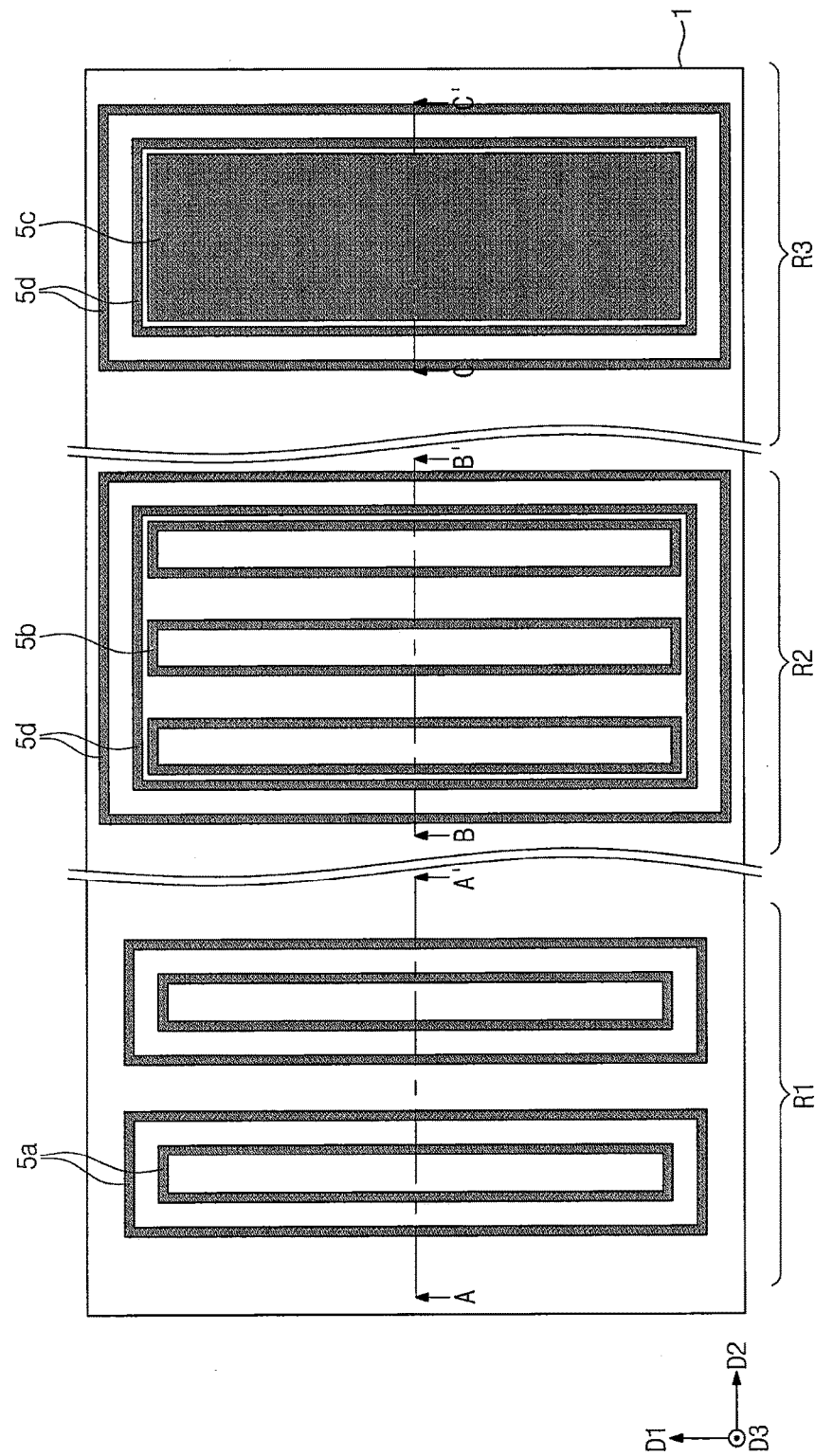

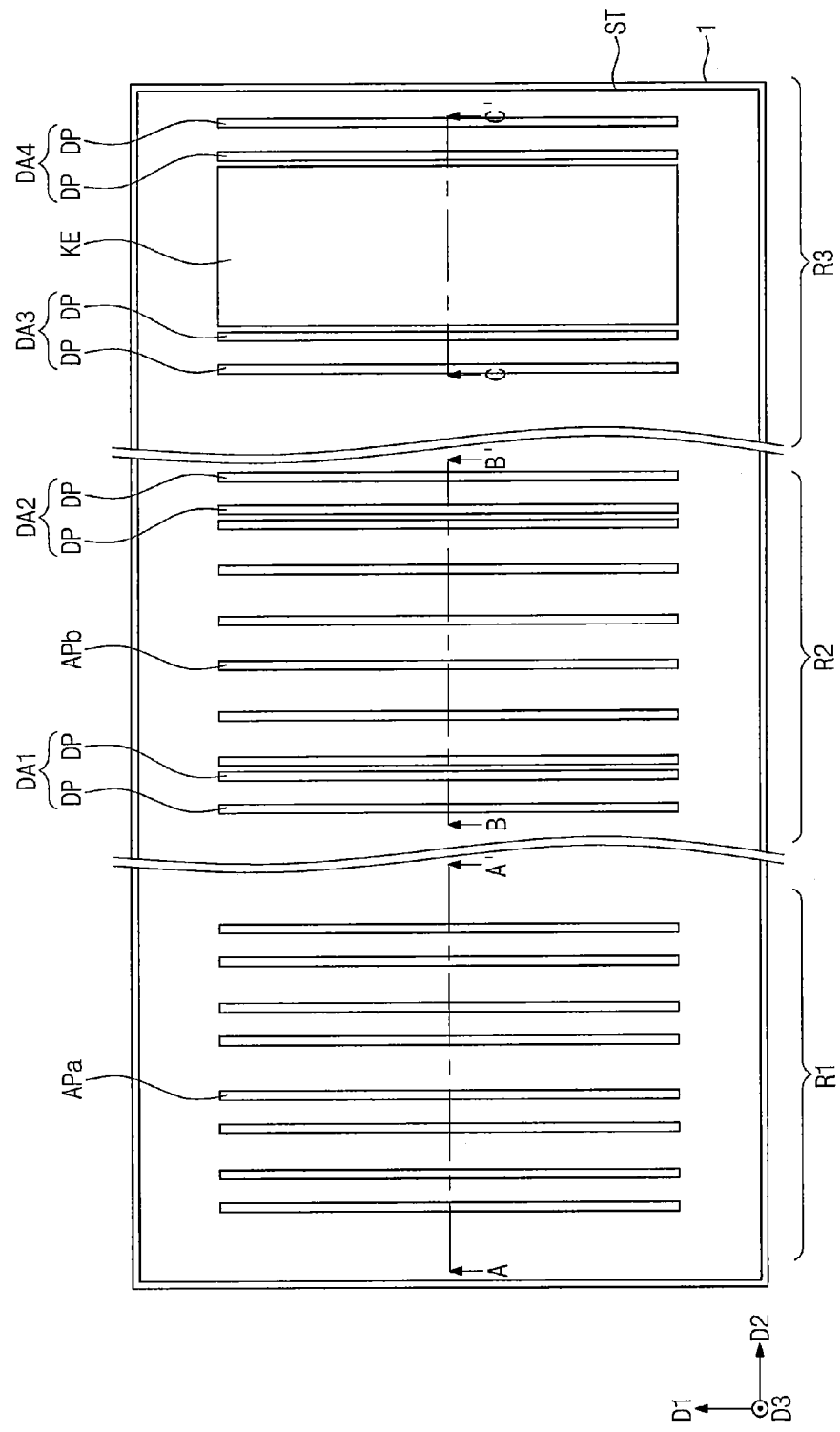

METHODS OF FABRICATING A SEMICONDUCTOR DEVICE

CROSS-REFERENCE TO RELATED APPLICATIONS

This U.S. non-provisional patent application claims priority under 35 U.S.C. § 119 to Korean Patent Application No. 10-2015-0014438, filed on Jan. 29, 2015, in the Korean Intellectual Property Office, the entire contents of which are hereby incorporated by reference.

BACKGROUND OF THE INVENTION

Semiconductor devices are increasingly being used in consumer, commercial and other electronic devices. The semiconductor devices may be classified into a memory device for storing data, a logic device for processing data, and a hybrid device including both of memory and logic elements. To meet the increased demand for electronic devices with fast speed and/or low power consumption, it may be necessary to realize semiconductor devices with high reliability, high performance, and/or multiple functions. To satisfy these technical requirements, complexity and/or integration density of semiconductor devices are being increased.

A double patterning technology is used to form fine patterns having a dimension smaller than a minimum feature size which an exposure apparatus can print. For example, in order to form such fine patterns, a conventional double patterning process may include steps of forming a spacer on a sidewall of a sacrificial pattern using photolithography and etching processes, of removing the sacrificial pattern, and of etching a to-be-etched layer using the spacer as an etch mask. However, as an integration density of a semiconductor device increases, it may be necessary to develop patterning methods allowing patterns to have a smaller size than that of the double patterning process.

SUMMARY

Example embodiments of the inventive concept provide methods of fabricating semiconductor devices with a region-dependent pattern density.

Other example embodiments of the inventive concept provide a semiconductor device including a plurality of regions whose pattern densities are dependent on positions thereof.

According to example embodiments of the inventive concept, a method of fabricating a semiconductor device may include sequentially forming a lower mold layer and an intermediate mold layer on a substrate with a first region and a second region, forming first upper mold patterns and first spacers on the intermediate mold layer, the first upper mold patterns and the first spacers being formed on the first and second regions, respectively, using different, but partially overlapping processes, etching the intermediate mold layer using the first upper mold patterns and the first spacers as an etch mask to form first and second intermediate mold patterns, respectively, forming second spacers to cover sidewalls of the first and second intermediate mold patterns, etching the lower mold layer using the second spacers as an etch mask to form lower mold patterns, and etching an upper portion of the substrate using the lower mold patterns as an etch mask to form active patterns.

In example embodiments, the forming of the first upper mold patterns and the first spacers may include forming first and second upper mold patterns on the intermediate mold layer to be disposed on the first and second regions, respectively, forming an etching-prevention pattern to cover at least one of the first upper mold patterns, forming the first spacers to cover sidewalls of the etching-prevention pattern and sidewalls of the second upper mold patterns, and removing the etching-prevention pattern and the second upper mold patterns. The at least one of the first upper mold patterns may remain after the removing of the etching-prevention pattern and the second upper mold patterns.

In example embodiments, the etching-prevention pattern may be formed of a material having an etch selectivity with respect to the second upper mold patterns. The forming of the first spacers may include forming a first spacer layer to cover the etching-prevention pattern and the second upper mold patterns, and anisotropically etching the first spacer layer to expose a top surface of the etching-prevention pattern and top surfaces of the second upper mold patterns. The removing of the etching-prevention pattern and the second upper mold patterns may include selectively removing the second upper mold patterns with the exposed top surfaces, while using the etching-prevention pattern to prevent the first upper mold patterns from being etched, and selectively removing the etching-prevention pattern, after the removing of the second upper mold patterns.

In example embodiments, the forming of the second intermediate mold patterns may include etching the intermediate mold layer using the first spacers positioned on both sidewalls of the etching-prevention pattern as an etch mask to form second intermediate mold patterns on the first region, some of the second spacers covers sidewalls of the second intermediate mold patterns positioned on the first region, and the active patterns may include dummy active patterns formed using the second spacers on sidewalls of the second intermediate mold patterns positioned on the first region.

In example embodiments, the forming of the lower mold patterns may include removing the first and second intermediate mold patterns, etching the lower mold layer using the second spacers on the first region as an etch mask to form first lower mold patterns, and etching the lower mold layer using the second spacers on the second region as an etch mask to form second lower mold patterns. The forming of the active patterns may include etching the upper portion of the substrate using the first and second lower mold patterns as an etch mask to form first and second active patterns, respectively. The first and second lower mold patterns may be formed at the same time, and the first and second active patterns may be formed at the same time.

In example embodiments, a width of each of the first upper mold patterns may be substantially equal to a distance between a pair of the active patterns on the first region.

In example embodiments, each of the first spacers may have a maximum width that may be substantially equal to a distance between a pair of the active patterns on the second region.

In example embodiments, the first upper mold patterns may have widths that are larger than a maximum width of the first spacers.

In example embodiments, the substrate may further include a third region, and the method may further include forming a third upper mold pattern on the intermediate mold layer and on the third region, the third upper mold pattern being formed at the same time as the first upper mold patterns, etching the intermediate mold layer using the third upper mold pattern as an etch mask to form a third intermediate mold pattern, etching the lower mold layer using the third intermediate mold pattern as an etch mask to form a third lower mold pattern, and etching the upper portion of the substrate using the third lower mold pattern as an etch mask to form a key pattern.

In example embodiments, the second spacers may be formed to cover sidewalls of the third intermediate mold pattern, and the forming of the third lower mold pattern may include etching the lower mold layer using the third intermediate mold pattern and the second spacers as an etch mask.

In example embodiments, the method may further include forming an intermediate mask layer between the intermediate mold layer and the first spacers and between the intermediate mold layer and the first and third upper mold patterns. The third intermediate mold pattern may have a width larger than that of each of the first and second intermediate mold patterns. The forming of the first to third intermediate mold patterns may include sequentially etching the intermediate mask layer and the intermediate mold layer using the first spacers and the first and third upper mold patterns as an etch mask to form first to third intermediate mold patterns and first to third intermediate mask patterns respectively disposed thereon, and then, removing the first and second intermediate mask patterns to leave the third intermediate mask pattern. The forming of the lower mold patterns may include removing the first and second intermediate mold patterns, and here, the third intermediate mold pattern may remain due to the presence of the third intermediate mask pattern.

In example embodiments, the method may further include forming device isolation layers to fill trenches between the active patterns and forming gate electrodes to cross the active patterns.

In example embodiments, the trenches may include a first trench between a pair of the active patterns on the first region and a second trench between a pair of the active patterns on the second region. The first trench may be formed to have a width larger than that of the second trench.

According to example embodiments of the inventive concept, a method of fabricating a semiconductor device may include forming a first upper mold pattern and a second upper mold pattern on a first region and a second region, respectively, of a substrate, performing first and second spacer-forming processes and first and second etching processes on the first region to form four first active patterns formed from the first upper mold pattern, the first and second etching processes being performed using first and second spacers formed by the first and second spacer-forming processes, and performing the second spacer-forming process and the second etching process on the second region to form two second active patterns formed from the second upper mold pattern, the second etching process being performed using the second spacer formed by the second spacer-forming process. The second upper mold pattern may be protected by an etching-prevention pattern covering the same, when the first spacer-forming process is performed.

In example embodiments, each of the first and second spacer-forming processes may include forming a spacer layer to conformally cover patterns exposed, and anisotropically etching the spacer layer to expose top surfaces of the patterns. The spacer layer may be formed spaced apart from the second upper mold pattern by the etching-prevention pattern interposed therebetween, when the first spacer-forming process is performed.

In example embodiments, a distance between the two second active patterns may be substantially equal to a width of the second upper mold pattern.

According to example embodiments of the inventive concept, a semiconductor device may include a substrate including a first region and a second region and including first active patterns, dummy active patterns, and second active patterns extending in a first direction, the first active patterns being provided on the first region, the dummy active patterns and the second active patterns being provided on the second region. The semiconductor device may further include device isolation layers filling trenches between the first active patterns, the dummy active patterns and the second active patterns. Here, a space between a pair of the second active patterns may be greater than that between a pair of the first active patterns, and the dummy active patterns may include a first group including a pair of dummy active patterns and a second group including another pair of dummy active patterns. The second active patterns may be provided between the first and second groups.

In example embodiments, the first and second active patterns and the dummy active patterns may have substantially the same width.

In example embodiments, a space between the dummy active patterns of the first or second group may be substantially the same as the space between the pair of the first active patterns.

In example embodiments, the semiconductor device may further include a gate electrode extending in a second direction and crossing the first and second active patterns protruding between the device isolation layers, and a gate insulating pattern interposed between the first and second active patterns and the gate electrode. Here, the first and second directions may be parallel to a top surface of the substrate and may cross each other.

Some embodiments of the present inventive concept include methods of fabricating a semiconductor device. Such methods may include sequentially forming a lower mold layer, an intermediate mold layer and an upper mold layer on a substrate with a first region and a second region, forming upper mold patterns, intermediate mold patterns and lower mold patterns, performing a quadruple patterning technology process in the first region using first spacers formed on the upper mold patterns and second spacers formed on the intermediate mold patterns, and performing a double patterning technology process in the second region using the second spacers formed on the intermediate mold patterns without using the first spacers formed on the upper mold patterns.

In some embodiments, performing the quadruple patterning technology process includes forming the upper mold patterns in the first region, forming a first spacer layer on the upper mold patterns in the first region, and etching the first spacer layer to form first spacers that cover sidewalls of the upper mold patterns in the first region. Some embodiments provide that performing the double patterning technology process includes forming the upper mold patterns in the second region in a same operation as the upper mold patterns are formed in the first region, forming an etching-prevention pattern in the second region, forming a first spacer layer on the etching-prevention pattern in the second region in a same operation as the first spacer layer is formed on the upper mold patterns in the first region, and etching the first spacer layer to form first spacers that cover sidewalls of the etching-prevention pattern in the second region in a same operation as the first spacer layer is etched to form first spacers that cover sidewalls of the upper mold patterns in the first region.

Some embodiments provide that performing the quadruple patterning technology process further includes forming the intermediate mold patterns in the first region using the first spacers in the first region, forming a second spacer layer on the intermediate mold patterns in the first region, and etching the second spacer layer to form second spacers that cover sidewalls of the intermediate mold patterns in the first region. In some embodiments, performing the double patterning technology process further includes forming the intermediate mold patterns in the second region using the first spacers and the upper mold patterns in a same operation as the intermediate mold patterns are formed in the first region using the first spacers in the first region, forming the second spacer layer on the intermediate mold patterns in the second region in a same operation as the second spacer layer is formed on the intermediate mold patterns in the first region, and etching the second spacer layer to form second spacers that cover sidewalls of the intermediate mold patterns in the second region in a same operation that the second spacer layer is etched to form second spacers that cover sidewalls of the intermediate patterns in the first region.

Some embodiments provide that performing the quadruple patterning technology process further includes forming the lower mold patterns in the first region using the second spacers in the first region and forming first active patterns in the substrate using the lower mold patterns in the first region. In some embodiments, performing the double patterning technology process further includes forming the lower mold patterns in the second region using the second spacers in a same operation as the lower mold patterns are formed in the first region using the second spacers in the first region and forming second active patterns in the substrate using the lower mold patterns in the second region in a same operation as the first active patterns are formed in the substrate.

In some embodiments, the first and second active patterns extend in a first direction and the method further includes forming a plurality of gate electrodes that extend in a second direction across the first and second active patterns.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 14A are plan views illustrating a method of fabricating a semiconductor device according to some example embodiments of the inventive concept, in sequence of operations.

FIGS. 1B through 14B are sectional views, each of which shows vertical sections taken along lines A-A', B-B', and C-C' of a corresponding one of FIGS. 1A through 14A.

Figure 1A:
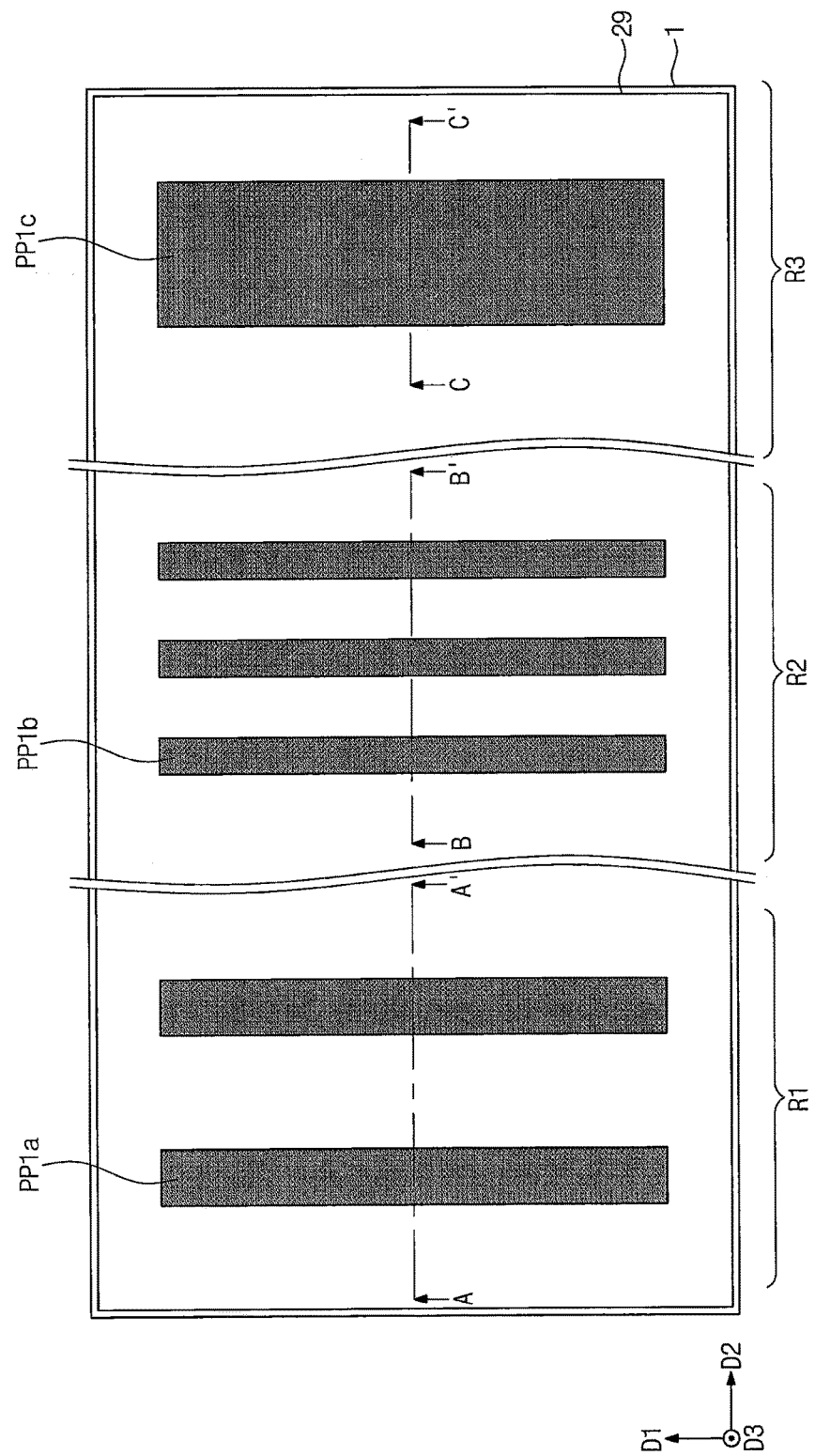

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIGS. 1A through 14A are plan views illustrating a method of fabricating a semiconductor device according to example embodiments of the inventive concept, in sequence of steps. FIGS. 1B through 14B are sectional views, each of which shows vertical sections taken along lines A-A', B-B', and C-C' of a corresponding one of FIGS. 1A through 14A.

Figure 1B:
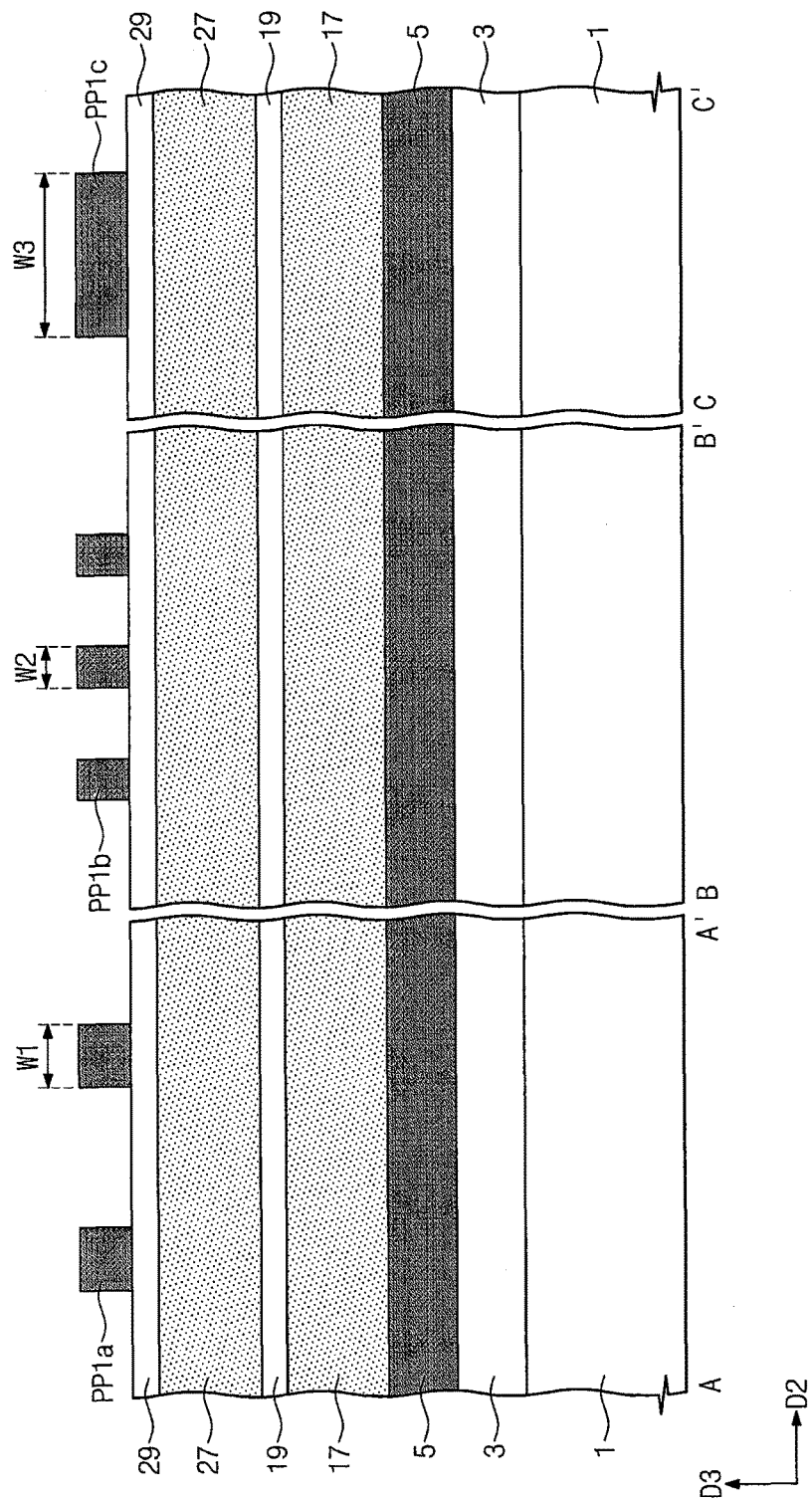

Referring to FIGS. 1A and 1B, a lower mold layer 3, a lower mask layer 5, an intermediate mold layer 17, an intermediate mask layer 19, an upper mold layer 27, and an upper mask layer 29 may be sequentially formed on a substrate 1.

The substrate 1 may include first, second, and third regions R1-R3. In example embodiments, the first region R1 may be a part of a logic cell, the second region R2 may be a part of an SRAM region, and the third region R3 may be a part of a scribe lane. The substrate 1 may be a single crystalline silicon wafer or a silicon-on-insulator (SOI) wafer. As an example, the lower mold layer 3 may be formed of or include at least one of a silicon oxide layer, a silicon oxynitride layer, and/or a silicon nitride layer. Although not shown, a pad oxide layer may be interposed between the substrate 1 and the lower mold layer 3. The lower mask layer 5 may be formed of a poly-silicon layer. The intermediate mold layer 17 may be formed of a Spin on hardmask (SOH) layer or a Spin-on Carbon (SOC) layer, and the upper mold layer 27 may be formed of a poly-silicon layer. The intermediate and upper mask layers 19 and 29 may be formed of the same material (e.g., a silicon oxynitride layer or a silicon nitride layer).

Photoresist patterns PP1a-PP1c may be formed on the upper mask layer 29. The photoresist patterns PP1a-PP1c may include the first photoresist patterns PP1a on the first region R1, the second photoresist patterns PP1b on the second region R2, and the third photoresist pattern PP1c on the third region R3. Each of the first to third photoresist patterns PP1a-PP1c may be shaped like a line extending in a first direction D1 parallel to a top surface of the substrate 1. The first photoresist patterns PP1a may be used to define outlines of first active patterns APa to be described below, the second photoresist patterns PP1b may be used to define outlines of second active patterns APb to be described below, and the third photoresist pattern PP1c may be used to define outlines of a key pattern KE to be described below. In particular, the second photoresist patterns PP1b may be used to define a space between the second active patterns APb.

Referring back to FIG. 1B, each of the first photoresist patterns PP1a may have a first width W1, and each of the second photoresist patterns PP1b may have a second width W2, and the third photoresist pattern PP1c may have a third width W3. In some example embodiments, the first to third widths W1-W3 may be different from each other, and for example, the first width W1 may be larger than the second width W2 and may be smaller than the third width W3.

Figure 2B:
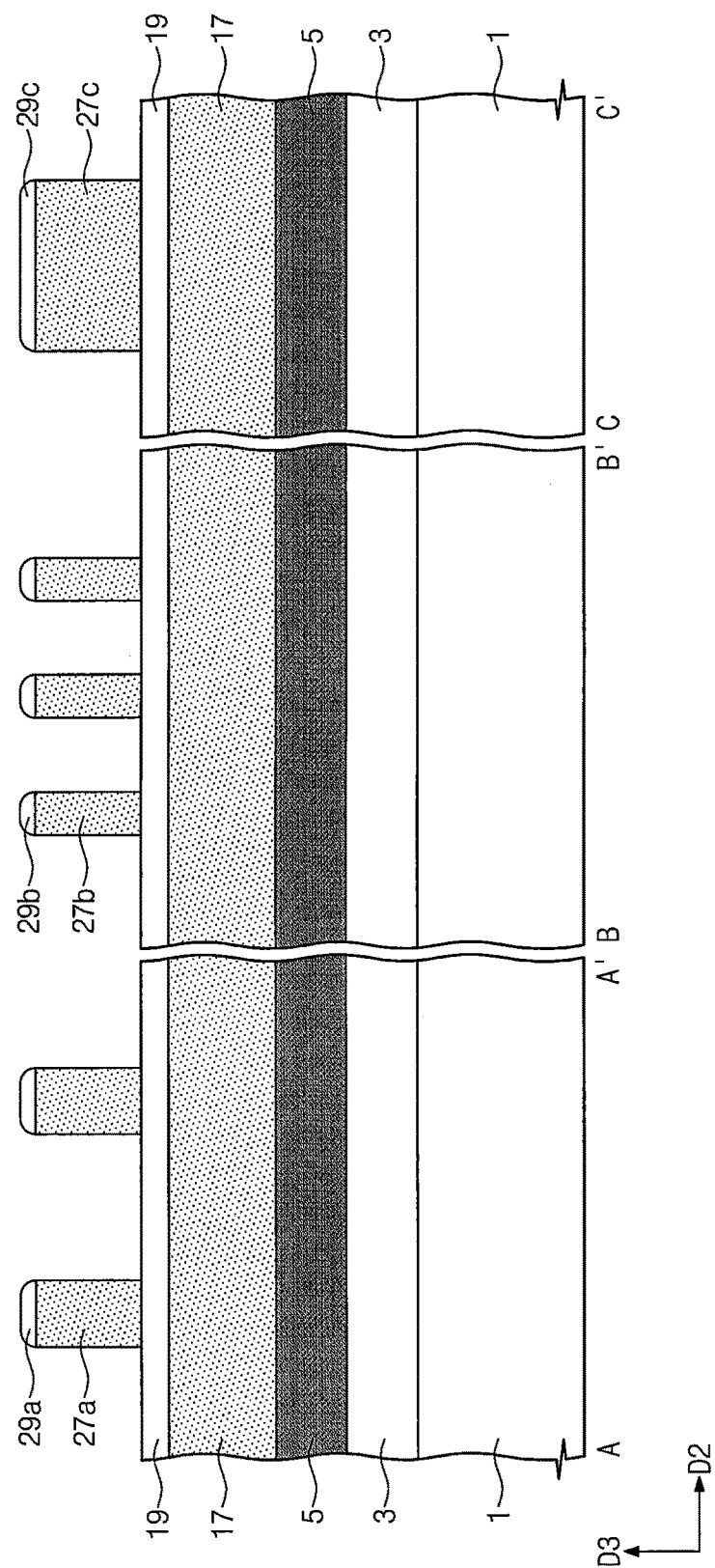

Referring to FIGS. 2A and 2B, the upper mask layer 29 may be etched using the first to third photoresist patterns PP1a-PP1c as an etch mask to form first to third upper mask patterns 29a-29c, respectively. Shapes of the first to third upper mask patterns 29a-29c may be transcribed from those of the first to third photoresist patterns PP1a-PP1c, and thus, when viewed in a plan view, the first to third upper mask patterns 29a-29c may have substantially the same shapes as those of the first to third photoresist patterns PP1a-PP1c.

Next, the upper mold layer 27 may be etched using the first to third upper mask patterns 29a-29c as an etch mask to form first to third upper mold patterns 27a-27c, respectively. When viewed in a plan view, the first to third upper mold patterns 27a-27c may have shapes substantially equal or corresponding to those of the first to third upper mask patterns 29a-29c. A top surface of the intermediate mask layer 19 may be partially exposed between the first to third upper mold patterns 27a-27c.

When the first to third upper mold patterns 27a-27c are formed, the first to third photoresist patterns PP1a-PP1c may be removed to expose top surfaces of the first to third upper mask patterns 29a-29c. In some embodiments, the first to third photoresist patterns PP1a-PP1c may be removed before the etching of the first to third upper mold patterns 27a-27c. The first to third upper mask patterns 29a-29c may be partially etched, during the formation of the first to third upper mold patterns 27a-27c.

Figure 3A:
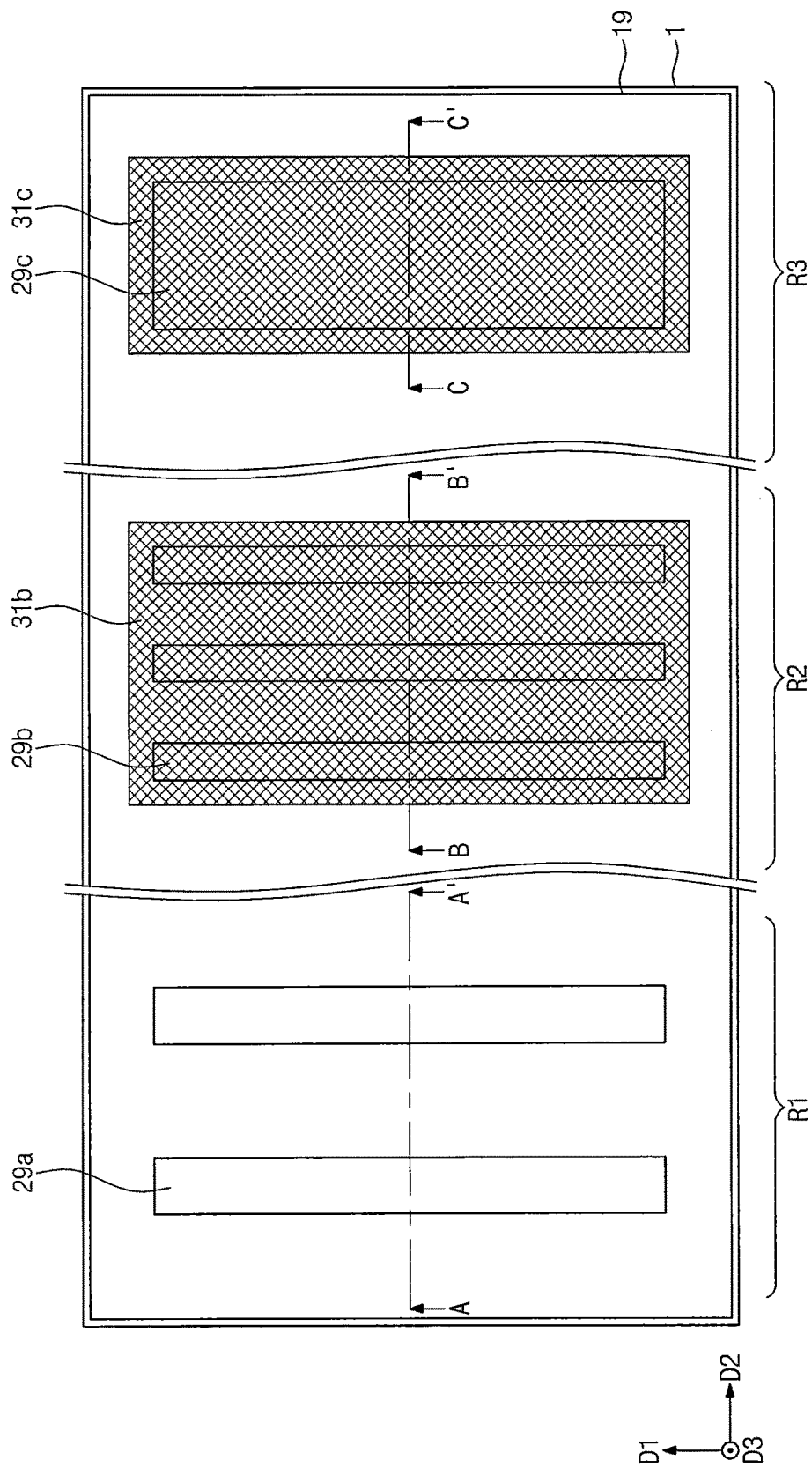

Referring to FIGS. 3A and 3B, first and second etching-prevention patterns 31b and 31c may be formed to cover the second and third upper mold patterns 27b and 27c. The first etching-prevention pattern 31b may be formed to completely cover the second upper mold patterns 27b and the second upper mask patterns 29b thereon. The second etching-prevention pattern 31c may be formed to completely cover the third upper mold pattern 27c and the third upper mask pattern 29c thereon.

The formation of the first and second etching-prevention patterns 31b and 31c may include forming an etching-prevention layer on the entire top surface of the substrate 1 and patterning the etching-prevention layer to form the first and second etching-prevention patterns 31b and 31c. Here, the patterning process may be performed to remove the etching-prevention layer from the first region R1. The first and second etching-prevention patterns 31b and 31c may be formed of, for example, an SOH layer.

Figure 4A:
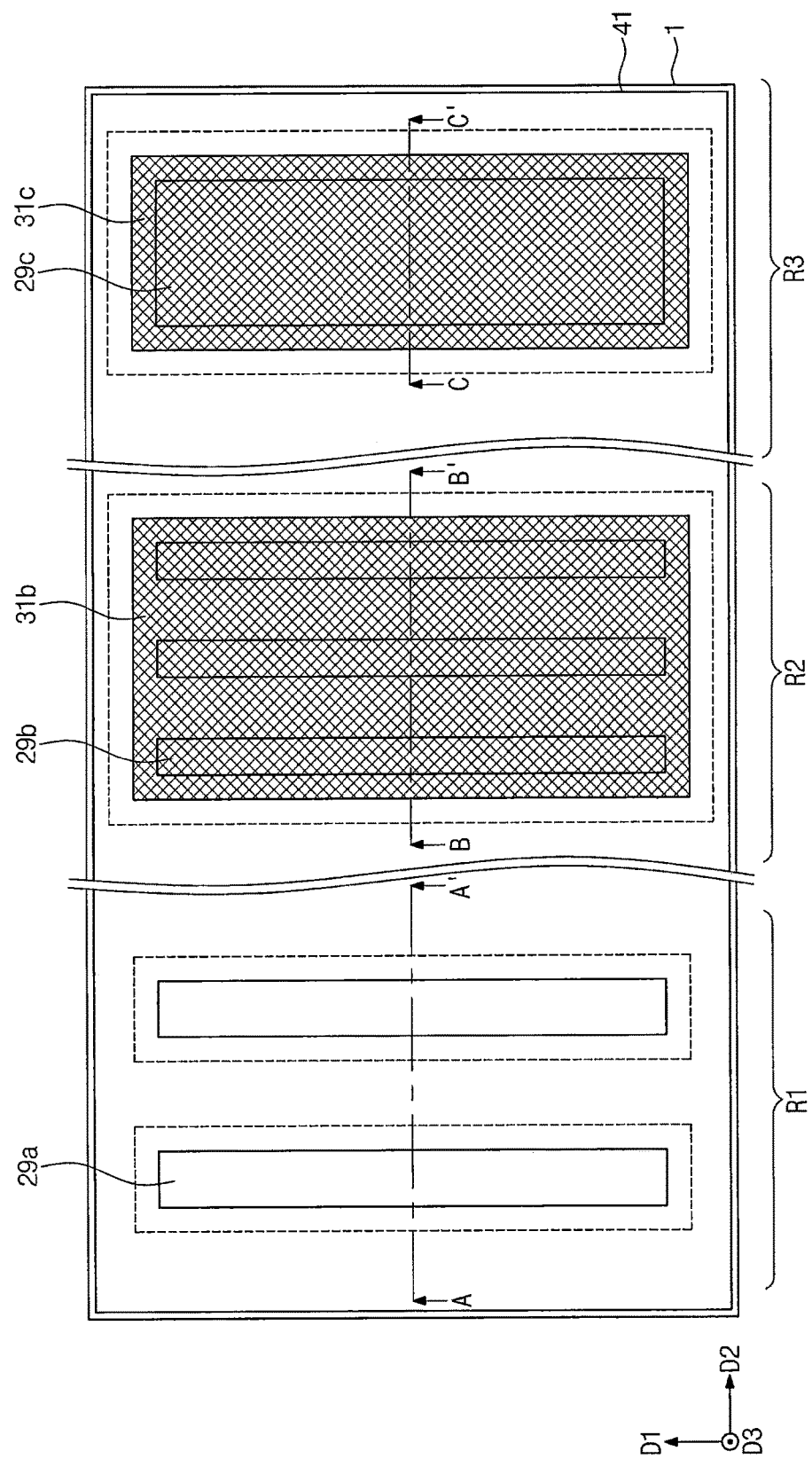
Figure 4B:
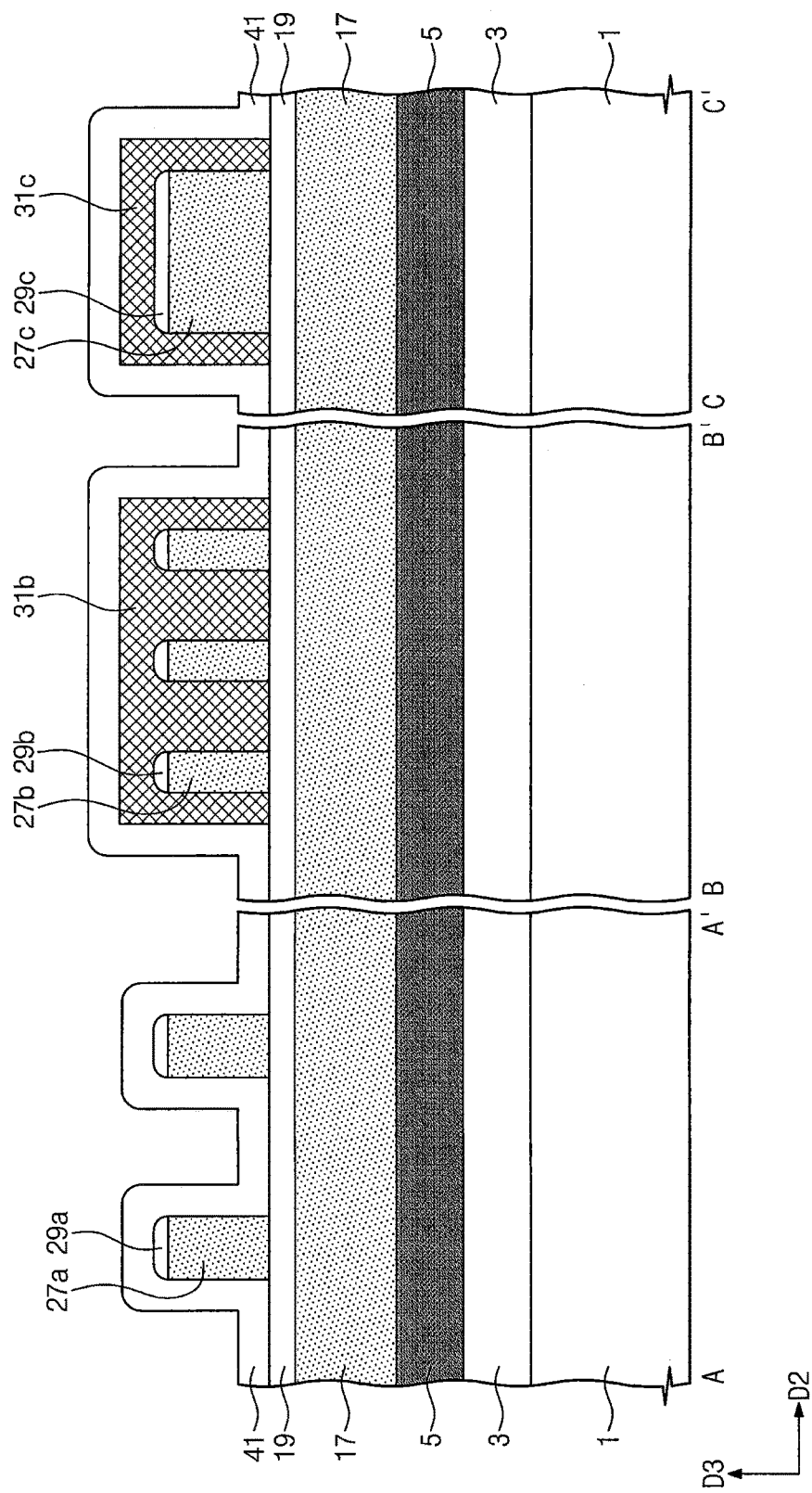

Referring to FIGS. 4A and 4B, a process of forming a first spacer may be performed. The process of forming the first spacer may include forming a first spacer layer 41 and etching the first spacer layer 41 to form first spacers 41s to be described below.

For example, the first spacer layer 41 may be conformally formed on the entire top surface of the substrate 1. The first spacer layer 41 may be formed of a material having an etch selectivity with respect to all of the intermediate mask layer 19, the upper mold layer 27, the upper mask layer 29, and the first and second etching-prevention patterns 31b and 31c, and for example, the first spacer layer 41 may be a silicon oxide layer formed by an ALD process. The first spacer layer 41 may be formed to have substantially the same thickness as a maximum width W4 of the first spacer 41s to be described below.

Figure 5A:
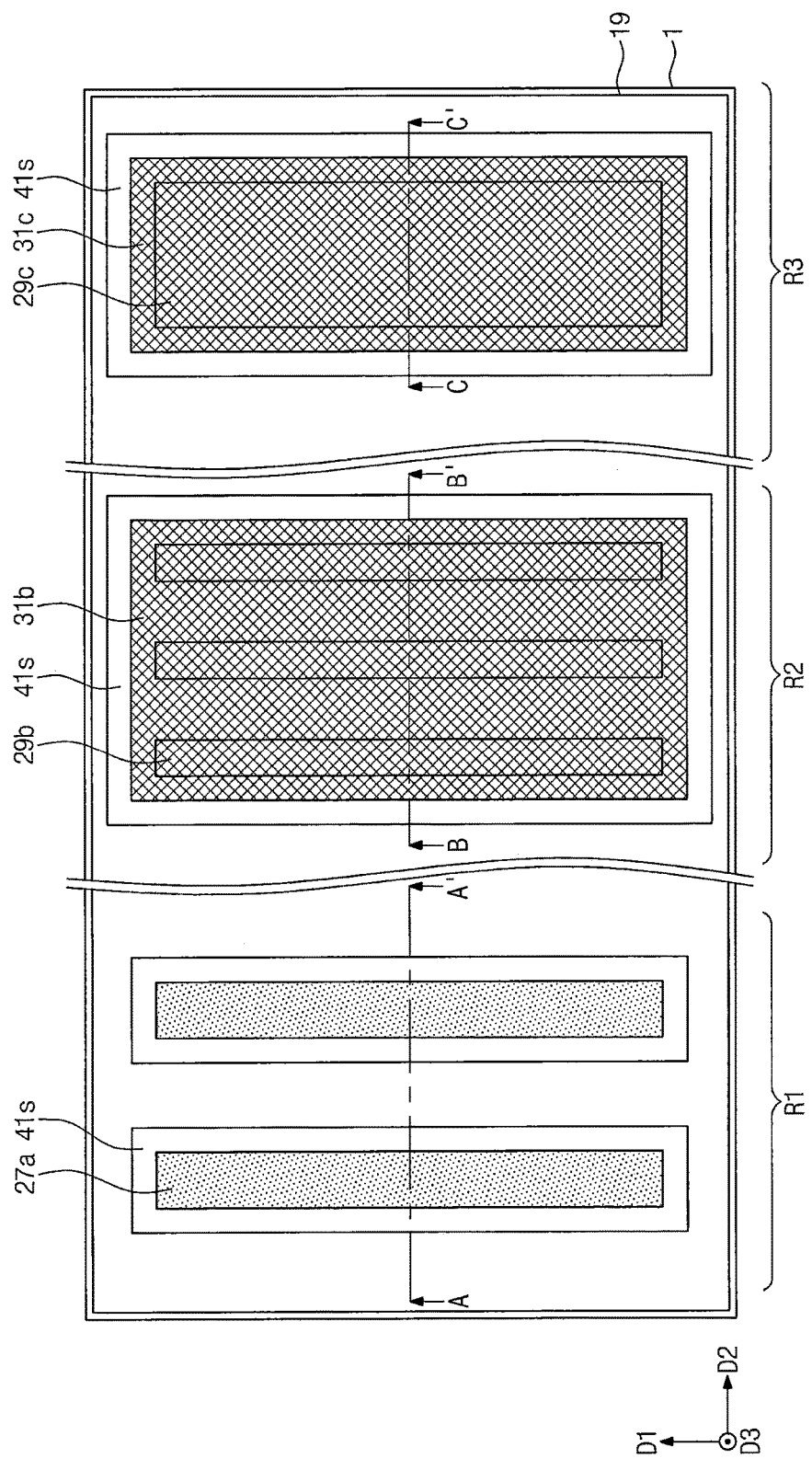
Figure 5B:
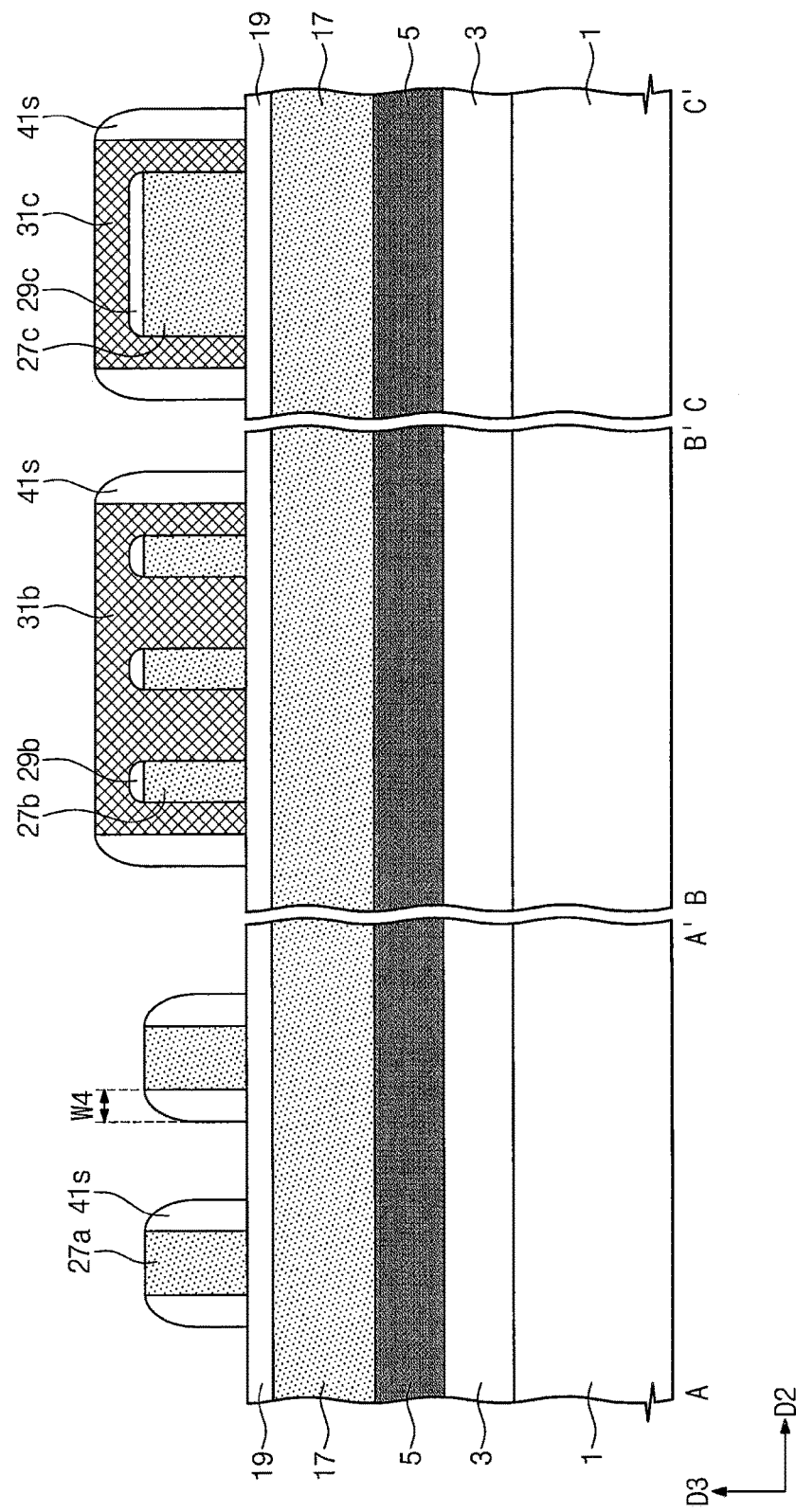

Referring to FIGS. 5A and 5B, the first spacer layer 41 may be anisotropically etched to form the first spacers 41s covering sidewalls of the first upper mold patterns 27a and the first and second etching-prevention patterns 31b and 31c. For example, the anisotropic etching process may be performed to expose top surfaces of the first upper mask patterns 29a and the first and second etching-prevention patterns 31b and 31c. All of the first spacers 41s on the first to third regions R1-R3 may have substantially the same maximum width of W4. Here, the first spacers 41s may be used to define a space between the first active patterns APa to be described below.

Thereafter, the first upper mask patterns 29a may be selectively removed to expose top surfaces of the first upper mold patterns 27a. Here, the first and second etching-prevention patterns 31b and 31c may remain even after the removal of the first upper mask patterns 29a, because they are formed to have an etch selectivity with respect to the first upper mask patterns 29a.

Figure 6B:
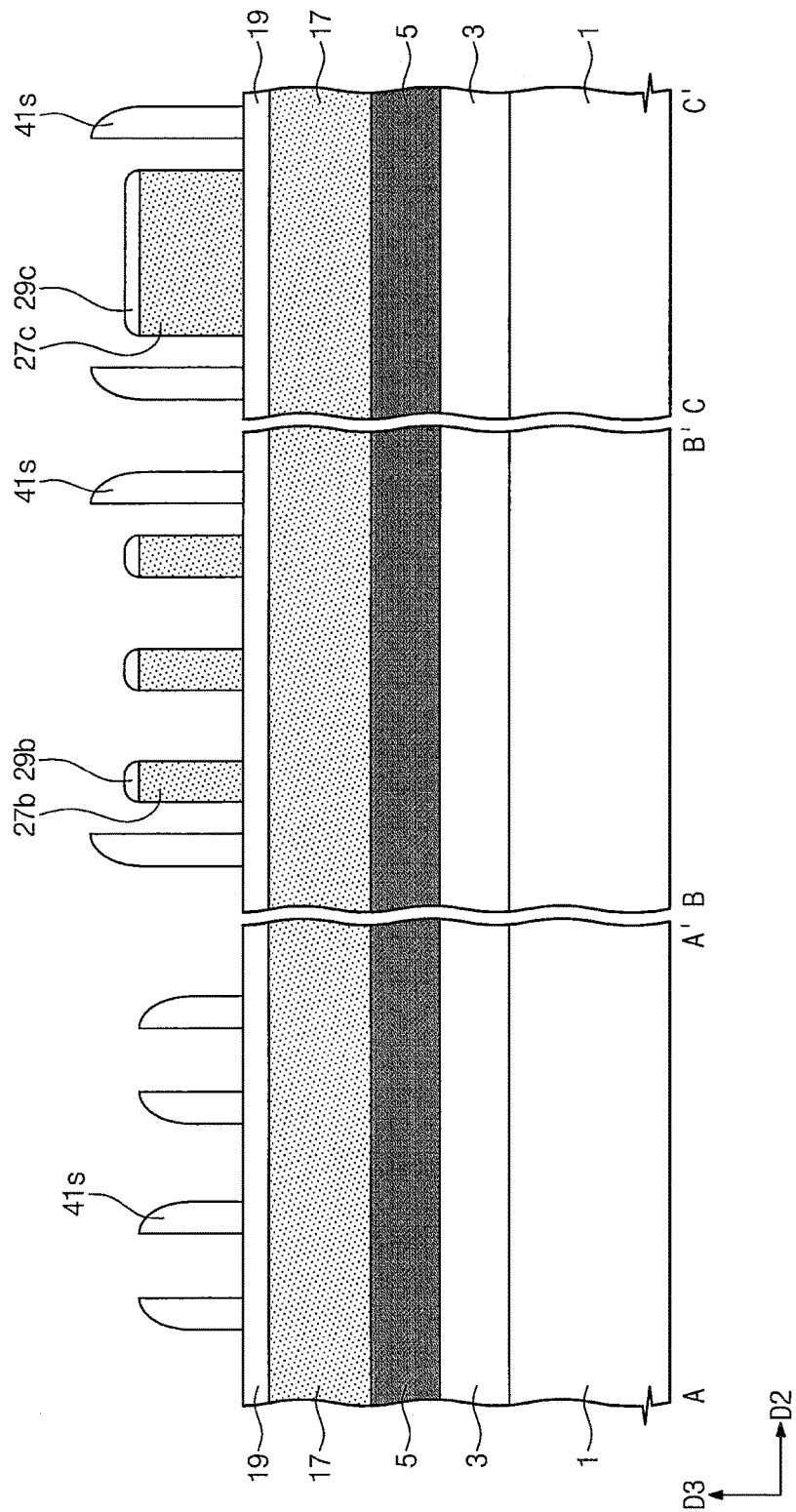

Referring to FIGS. 6A and 6B, the first upper mold patterns 27a may be selectively removed. Here, the first and second etching-prevention patterns 31b and 31c may remain even after the removal of the first upper mold patterns 27a, because they are formed to have an etch selectivity with respect to the first upper mold patterns 27a.

Thereafter, the first and second etching-prevention patterns 31b and 31c may be selectively removed. In the case where the first and second etching-prevention patterns 31b and 31c are formed of an SOH layer, the selective removal of the first and second etching-prevention patterns 31b and 31c may be performed by an ashing process, in which oxygen is used. As a result of the removal of the first and second etching-prevention patterns 31b and 31c, the second and third upper mask patterns 29b and 29c and the second and third upper mold patterns 27b and 27c may be exposed. To sum up, the use of the first and second etching-prevention patterns 31b and 31c makes it possible to form only the first spacers 41s on the first region and to allow the first spacers 41s and the second and third upper mold patterns 27b and 27c to remain on the second and third regions, respectively.

Figure 7B:
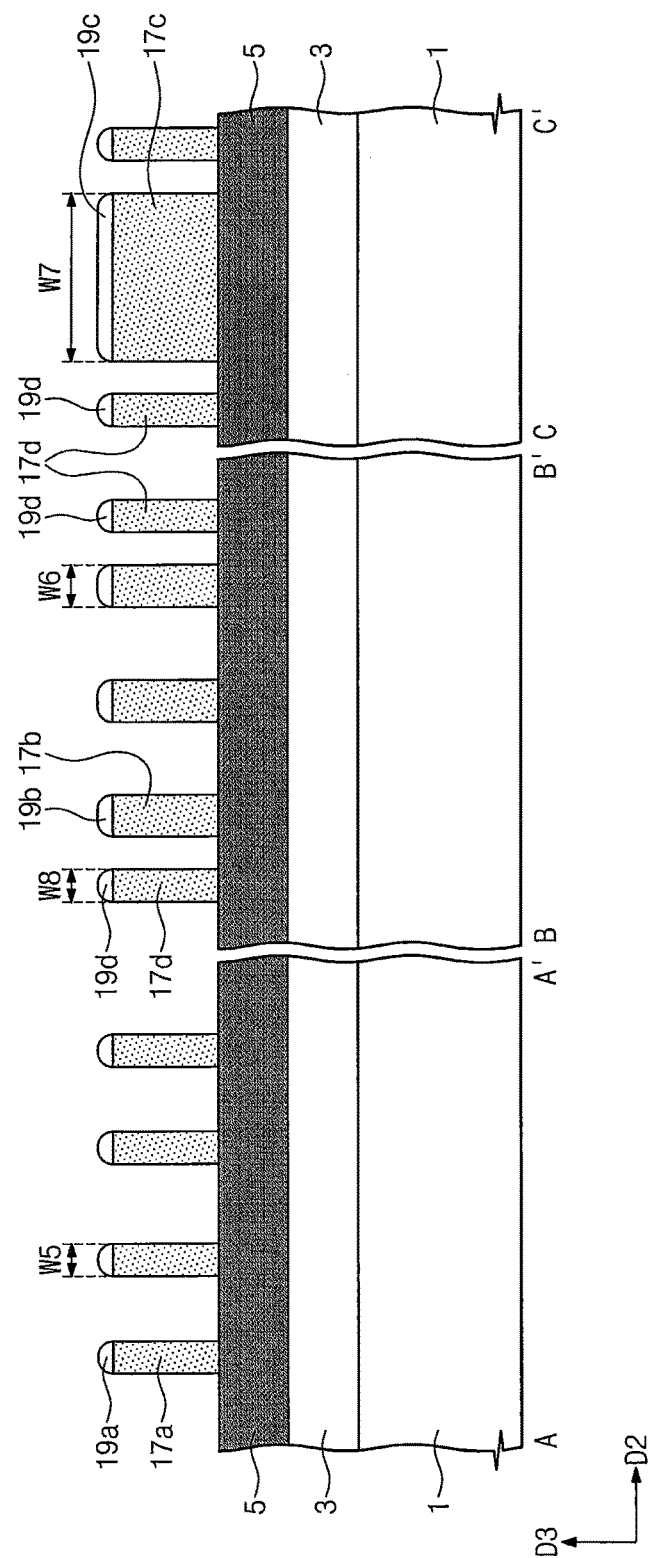

Referring to FIGS. 7A and 7B, a first etching process may be performed. The first etching process may include forming first to fourth intermediate mold patterns 17a-17d.

For example, the intermediate mask layer 19 may be etched using the first spacers 41s and the second and third upper mold patterns 27b and 27c as an etch mask to form first to fourth intermediate mask patterns 19a-19d, respectively. When viewed in a plan view, the first intermediate mask patterns 19a may have shapes substantially equal or corresponding to those of the first spacers 41s on the first region R1, and the fourth intermediate mask patterns 19d may have shapes substantially equal or corresponding to those of the first spacers 41s on the second and third regions R2 and R3. In addition, the second and third intermediate mask patterns 19b and 19c may have shapes substantially equal or corresponding to those of the second and third upper mold patterns 27b and 27c.

Thereafter, the intermediate mold layer 17 may be etched using the first to fourth intermediate mask patterns 19a-19d as an etch mask to form the first to fourth intermediate mold patterns 17a-17d, respectively. When viewed in a plan view, the first to fourth intermediate mold patterns 17a-17d may have shapes substantially equal or corresponding to those of the first to fourth intermediate mask patterns 19a-19d. The first to fourth intermediate mold patterns 17a-17d may be formed to partially expose a top surface of the lower mask layer 5 therebetween.

Referring back to FIG. 7B, each of the first intermediate mold patterns 17a may be formed to have a width W5 which is substantially equal to the maximum width W4 of the first spacers 41s. Each of the second intermediate mold patterns 17b may be formed to have a width W6, which is substantially equal to the second width W2 of the second photoresist patterns PP1b. The third intermediate mold pattern 17c may be formed to have a width W7, which is substantially equal to the third width W3 of the third photoresist pattern PP1c. Each of the fourth intermediate mold patterns 17d may be formed to have a width W8, which is substantially equal to the width W5 of the first intermediate mold patterns 17a.

Figure 8A:
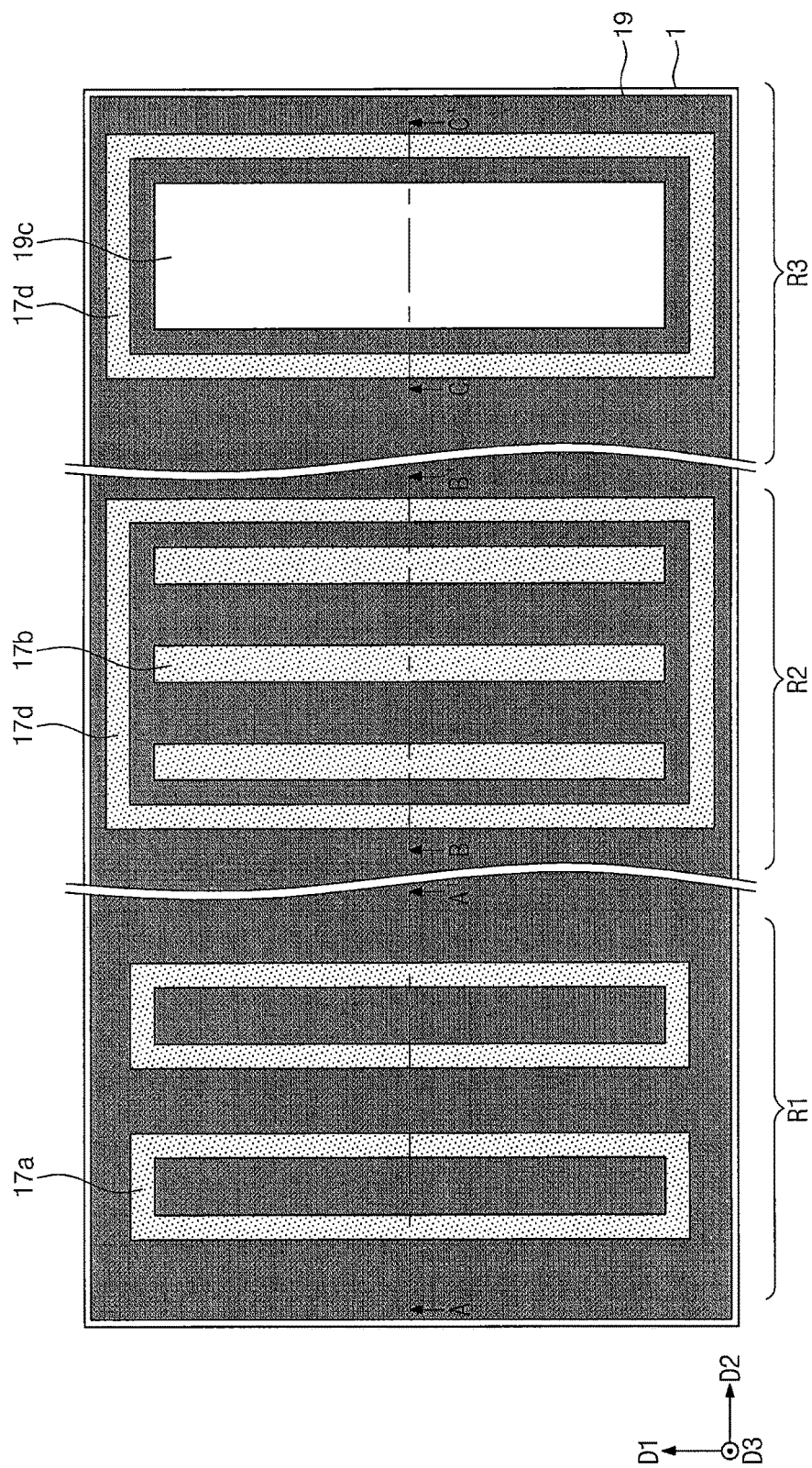
Figure 8B:
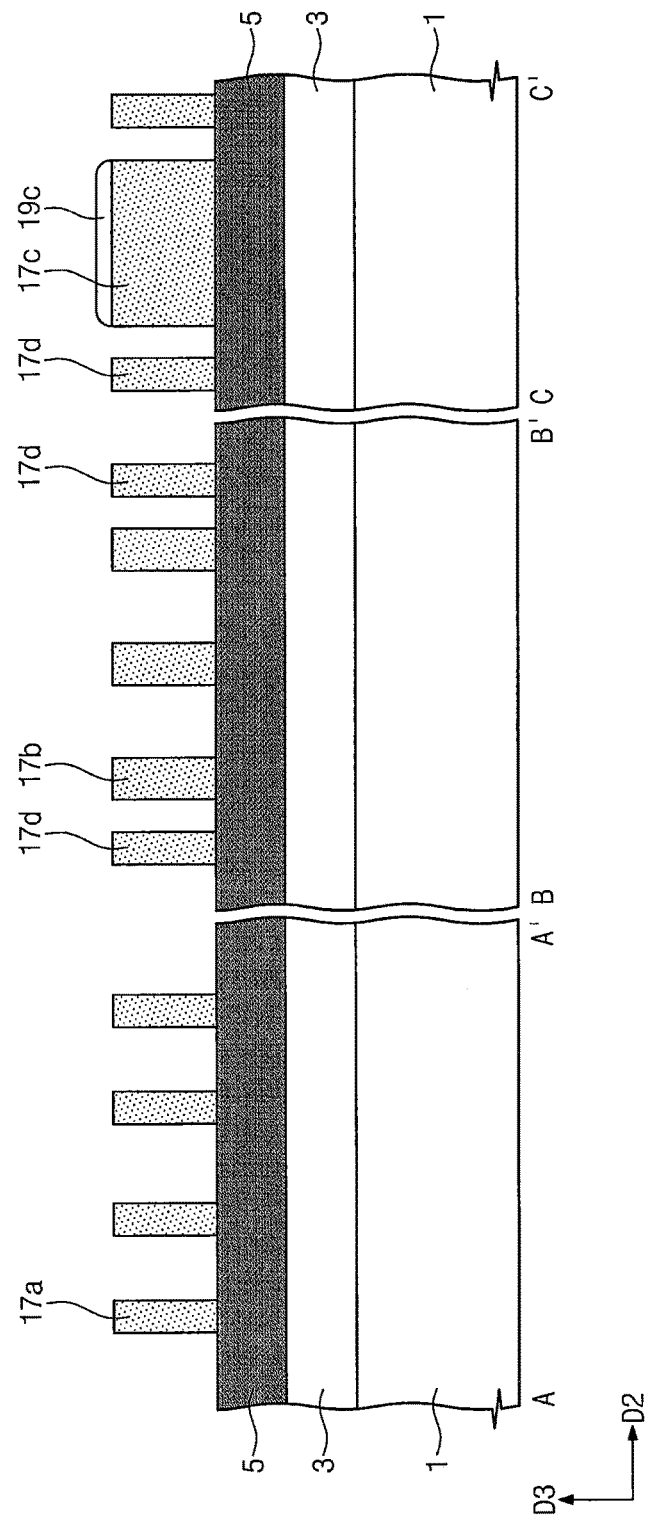

Referring to FIGS. 8A and 8B, the first, second, and fourth intermediate mask patterns 19a, 19b, and 19d may be selectively removed to expose top surfaces of the first, second, and fourth intermediate mold patterns 17a, 17b, and 17d. By controlling an etching condition (e.g., etch rates) in this removal process, the third intermediate mask pattern 19c may be prevented from being completely removed; that is, it may remain on the third intermediate mold pattern 17c. In detail, referring back to FIGS. 7A and 7B, the third intermediate mask pattern 19c may be formed to be thicker than the first, second, and fourth intermediate mask patterns 19a, 19b, and 19d, because the third intermediate mask pattern 19c is formed to have a larger width than those of the first, second, and fourth intermediate mask patterns 19a, 19b, and 19d. This is because an etch rate of the intermediate mask layer 19 may be dependent on a pattern width.

Figure 9A:
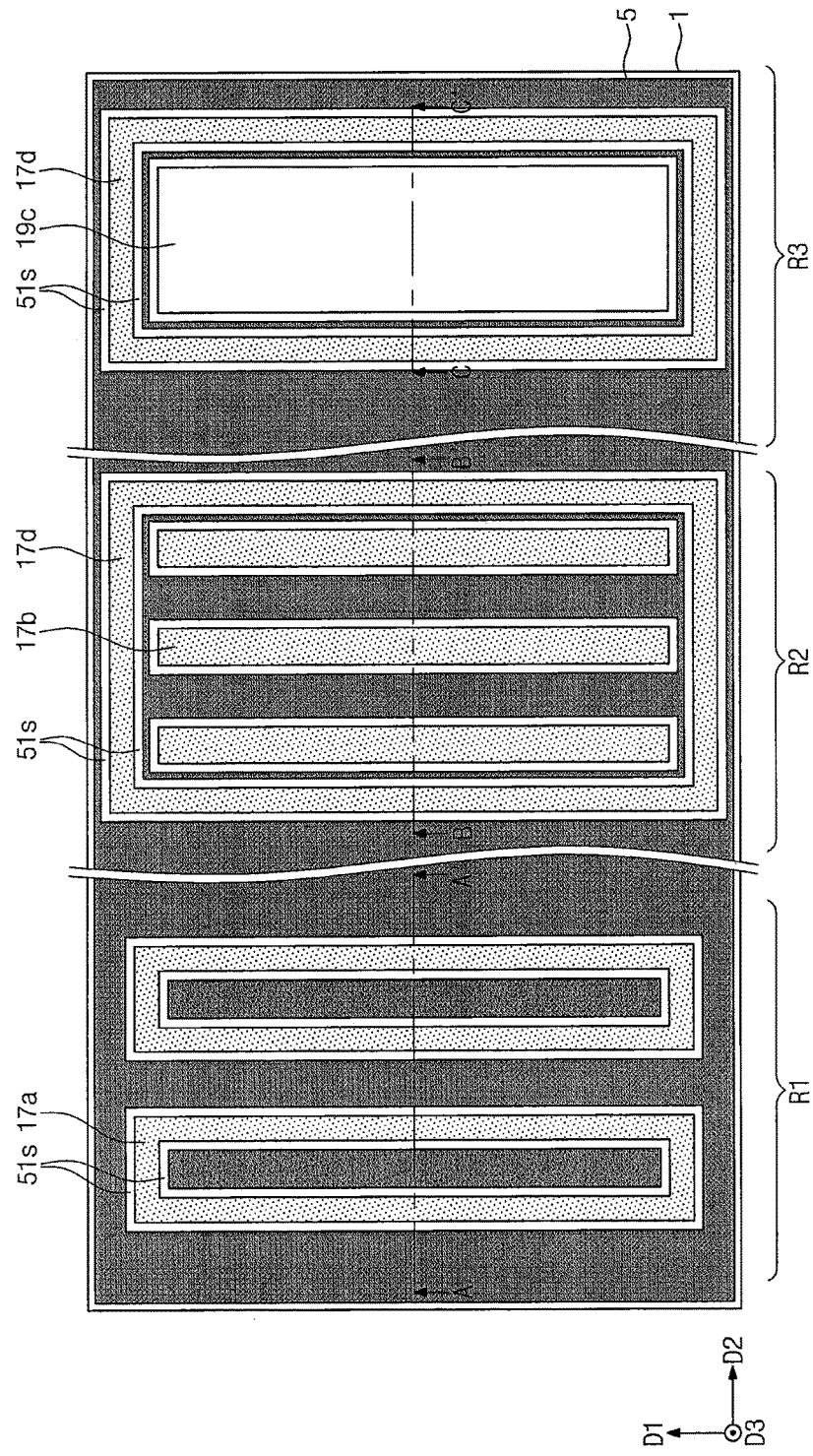
Figure 9B:
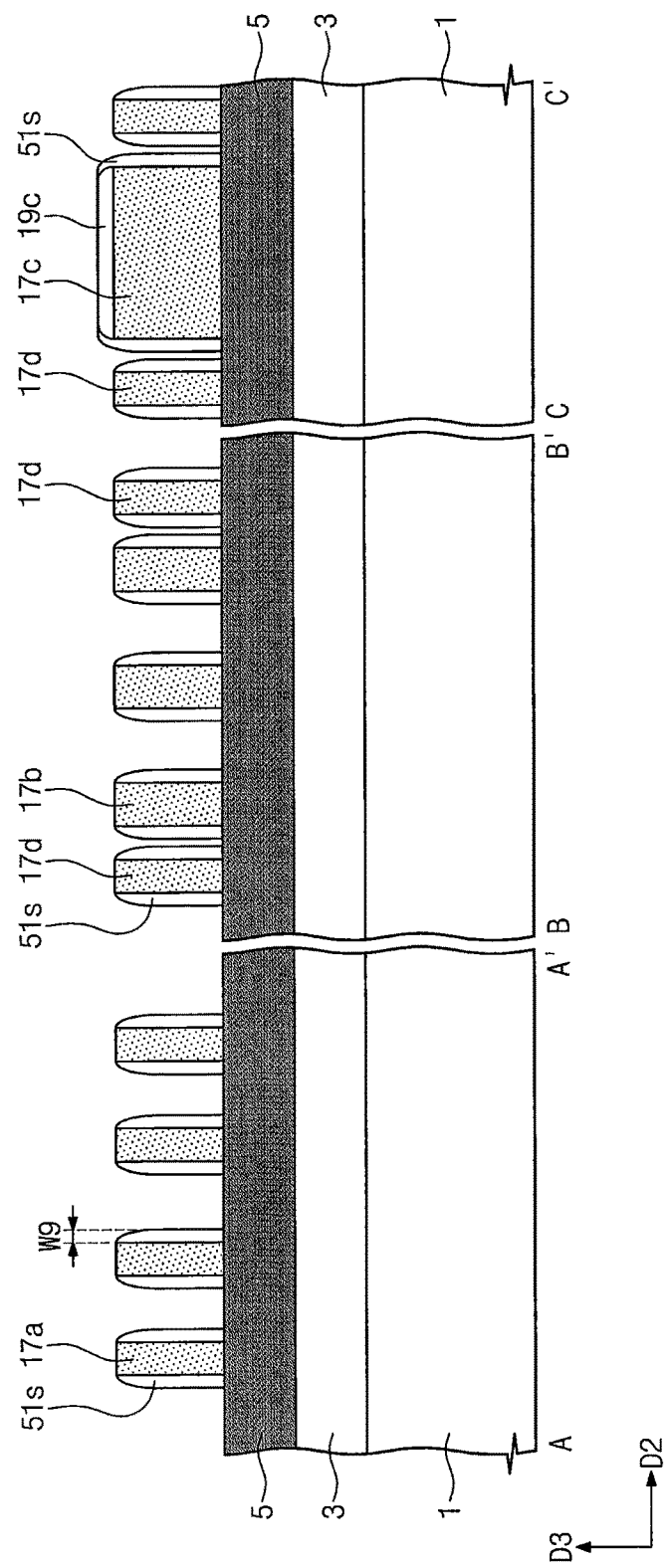

Referring to FIGS. 9A and 9B, a process of forming a second spacer may be performed. The process of forming the second spacer may include steps of forming a second spacer layer (not shown) and etching the second spacer layer to form second spacers 51s.

In detail, the second spacer layer may be conformally formed on the entire top surface of the substrate 1. As an example, the second spacer layer may be formed of a material having an etch selectivity with respect to all of the intermediate mold layer 17, the intermediate mask layer 19, and the lower mask layer 5, and for example, the second spacer layer may be a silicon oxide layer formed by an ALD process.

Thereafter, the second spacer layer may be anisotropically etched to form the second spacers 51s covering sidewalls of the first to fourth intermediate mold patterns 17a-17d. Each of the second spacers 51s may be formed to have a maximum width W9, which is substantially equal to the widths of the first and second active patterns APa and APb to be described below. The maximum widths W9 of the second spacers 51s may be substantially the same, regardless of positions of the first to third regions R1-R3.

Figure 10A:
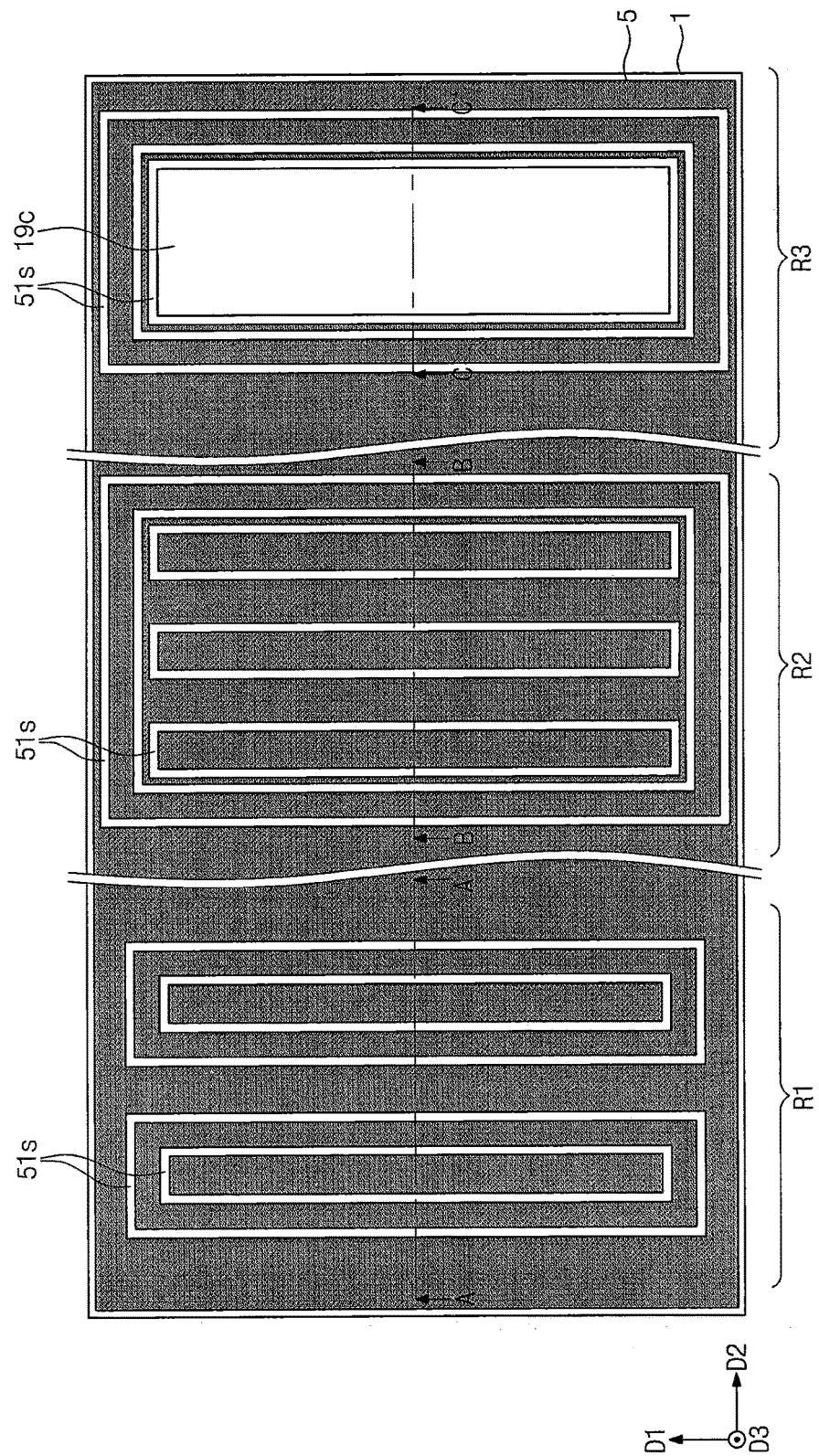

Referring to FIGS. 10A and 10B, the first, second, and fourth intermediate mold patterns 17a, 17b, and 17d may be removed. For example, the first, second, and fourth intermediate mold patterns 17a, 17b, and 17d may be selectively removed to expose the second spacers 51s and the top surface of the lower mask layer 5. In the case where the intermediate mold layer 17 is formed of a SOH layer, the selective removal of the first, second, and fourth intermediate mold patterns 17a, 17b, and 17d may be performed by an ashing process, in which oxygen is used. Here, the third intermediate mask pattern 19c may prevent the third intermediate mold pattern 17c from being etched.

Figure 11B:
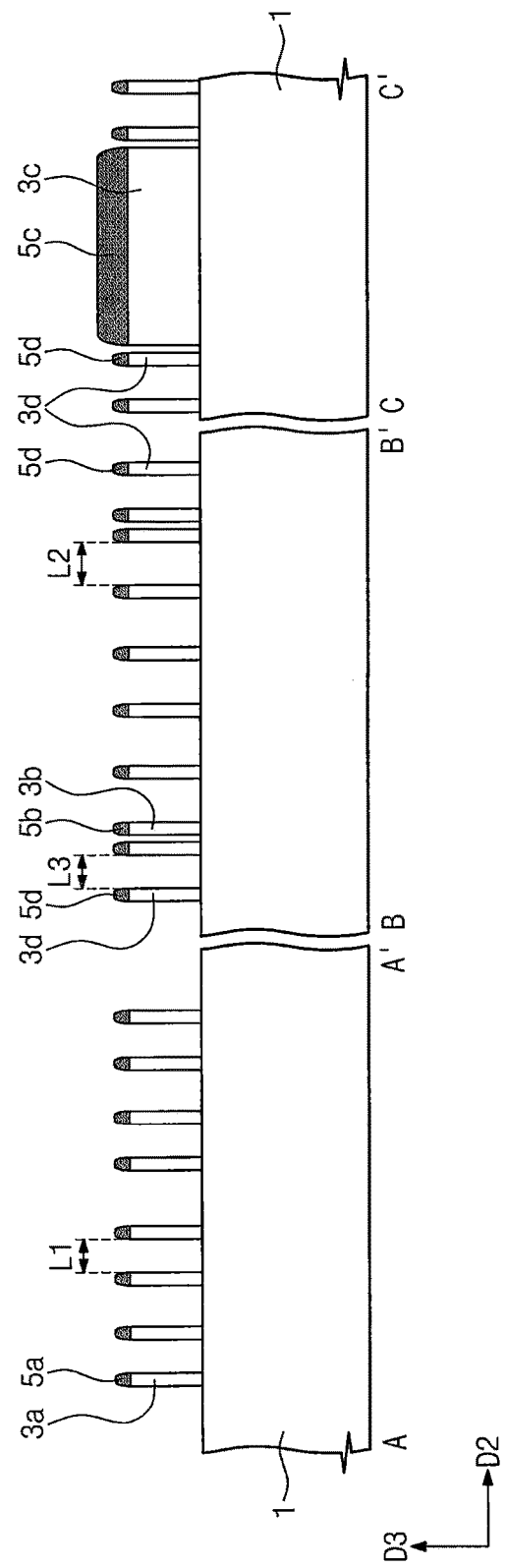

Referring to FIGS. 11A and 11B, a second etching process may be performed. In example embodiments, the second etching process may include forming first to fourth lower mold patterns 3a-3d.

In detail, the lower mask layer 5 may be etched using the second spacers 51s as an etch mask to form first, second, and fourth lower mask patterns 5a, 5b, and 5d. Here, the lower mask layer 5 may be etched using the remaining third intermediate mold pattern 17c and the second spacers 51s on both sidewalls thereof as an etch mask to form a third lower mask pattern 5c. When viewed in a plan view, the first lower mask patterns 5a may have shapes substantially equal or corresponding to those of the second spacers 51s on the first region R1, and the second lower mask patterns 5b may have shapes substantially equal or corresponding to those of the second spacers 51s covering both sidewalls of the second intermediate mold patterns 17b, and the third lower mask pattern 5c may have shapes substantially equal or corresponding to those of the third intermediate mold pattern 17c and the second spacers 51s on both sidewalls thereof, and the fourth lower mask patterns 5d may have shapes substantially equal or corresponding to those of the second spacers 51s covering both sidewalls of the fourth intermediate mold patterns 17d.

Thereafter, the lower mold layer 3 may be etched using the first to fourth lower mask patterns 5a-5d as an etch mask to form the first to fourth lower mold patterns 3a-3d, respectively. When viewed in a plan view, the first to fourth lower mold patterns 3a-3d may have shapes substantially equal or corresponding to those of the first to fourth lower mask patterns 5a-5d. The first to fourth lower mold patterns 3a-3d may be formed to partially expose a top surface of the substrate 1 therebetween.

Referring back to FIG. 11A, each of the first, second, and fourth lower mask patterns 5a, 5b, and 5d and the first, second, and fourth lower mold patterns 3a, 3b, and 3d may have a closed-curve shape, when viewed in a plan view.

Figure 12A:
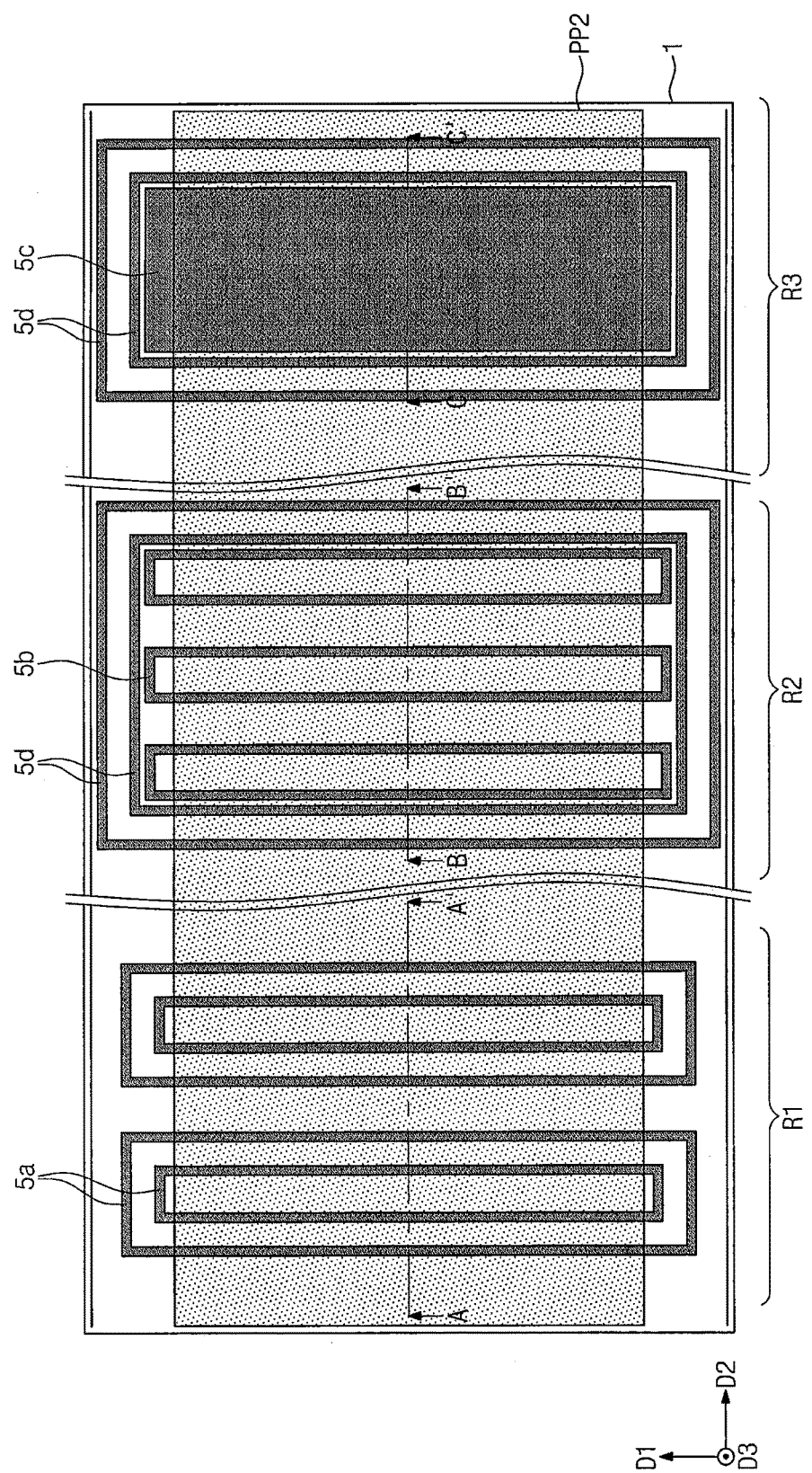
Figure 12B:
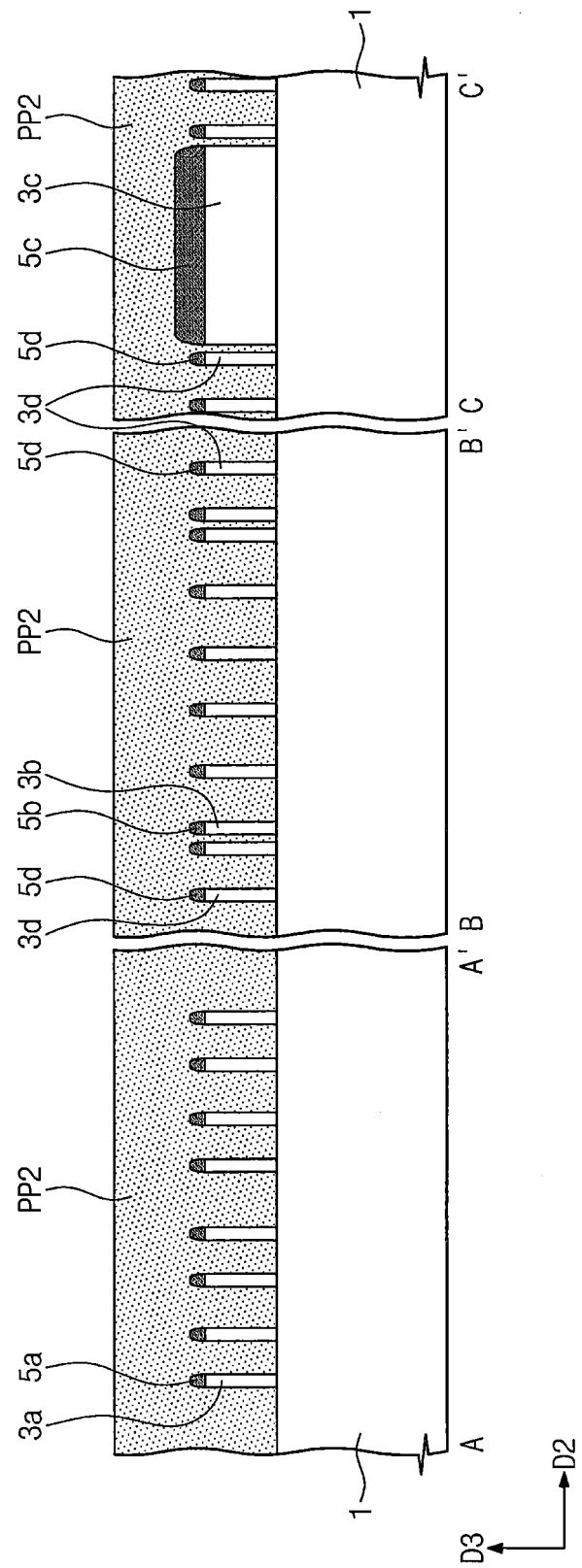

Referring to FIGS. 12A and 12B, when viewed in a plan view, a shielding pattern PP2 may be formed to cover portions of the first to fourth lower mask patterns 5a-5d and the first to fourth lower mold patterns 3a-3d. The shielding pattern PP2 may be formed to extend parallel to the second direction D2 and span the first to third regions R1-R3. Further, when viewed in a plan view, the shielding pattern PP2 may be formed to expose both end portions (i.e., other portions) of the first to fourth lower mask patterns 5a-5d and the first to fourth lower mold patterns 3a-3d. In other words, the first to fourth lower mask patterns 5a-5d and the first to fourth lower mold patterns 3a-3d may include portions, which are overlapped with the shielding pattern PP2 in a plan view, and each of which is shaped like a line extending parallel to the first direction D1. In some example embodiments, the shielding pattern PP2 may be photoresist patterns.

Figure 13B:
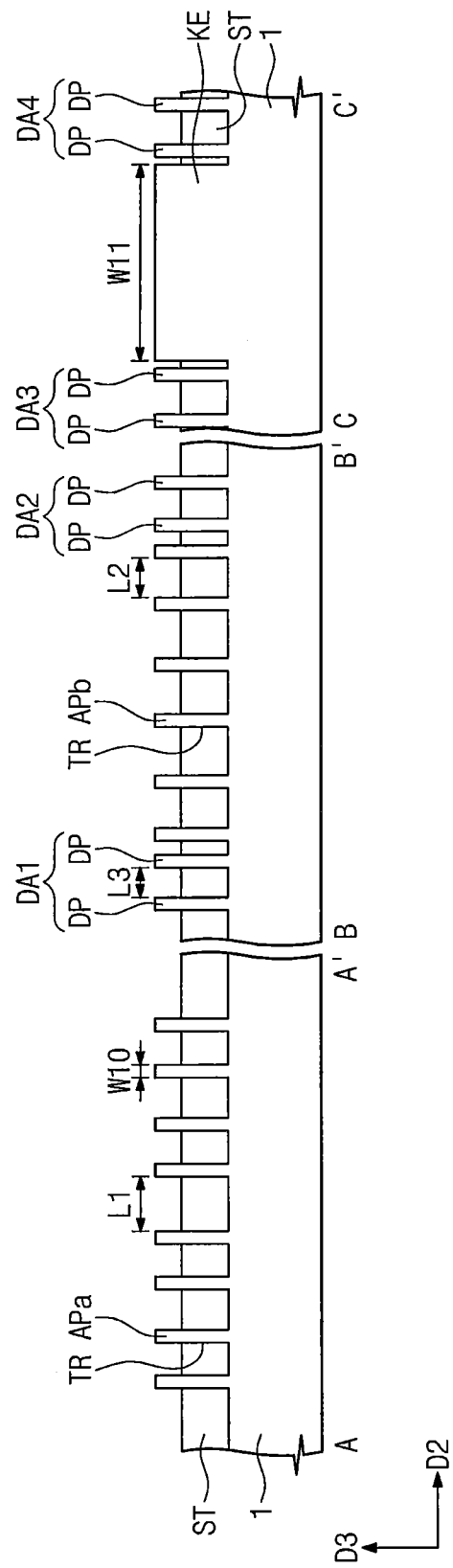

Referring to FIGS. 13A and 13B, an etching process using the shielding pattern PP2 as an etch mask may be performed to remove the end portions of the first to fourth lower mask patterns 5a-5d and the first to fourth lower mold patterns 3a-3d exposed by the shielding pattern PP2. Accordingly, the top surface of the substrate 1 may be exposed by the shielding pattern PP2.

Thereafter, the shielding pattern PP2 may be selectively removed. An upper portion of the substrate 1 may be etched using the remaining portions of the first to fourth lower mold patterns 3a-3d as an etch mask, and thus, first and second active patterns APa and APb, dummy active patterns DP, and a key pattern KE may be formed in the upper portion of the substrate 1. When viewed in a plan view, the first active patterns APa may have shapes substantially equal or corresponding to those of the first lower mold patterns 3a, the second active patterns APb may have shapes substantially equal or corresponding to those of the second lower mold patterns 3b, the dummy active patterns DP may have shapes substantially equal or corresponding to those of the fourth lower mold patterns 3d, and the key pattern KE may have shapes substantially equal or corresponding to that of the third lower mold pattern 3c.

The first and second active patterns APa and APb, the dummy active patterns DP, and the key pattern KE may be a line-shaped structure extending parallel to the first direction D1. The first and second active patterns APa and APb, the dummy active patterns DP, and the key pattern KE may be spaced apart from each other in the second direction D2. Two pairs of the dummy active patterns DP may be formed on the second region R2. One of the two pairs of the dummy active patterns DP may constitute a first group DA1, and the other may constitute a second group DA2. Here, the second active patterns APb may be formed between the first group DA1 and the second group DA2. Further, two pairs of the dummy active patterns DP may be formed on the third region R3. One of the two pairs of the dummy active patterns DP may constitute a third group DA3, and the other may constitute a fourth group DA4. Here, the key pattern KE may be formed between the third group DA3 and the fourth group DA4.

Next, device isolation layers ST may be formed to fill trenches formed between the first and second active patterns APa and APb, the dummy active patterns DP, and the key pattern KE. In some example embodiments, the formation of the device isolation layers ST may include forming an oxide layer on the substrate 1 to cover the first and second active patterns APa and APb, the dummy active patterns DP, and the key pattern KE, and then, performing an etch-back process on the oxide layer. The etch-back process may be performed such that the device isolation layers ST have top surfaces lower than those of the first and second active patterns APa and APb, the dummy active patterns DP, and the key pattern KE.

Referring back to FIG. 13B, the first and second active patterns APa and APb and the dummy active patterns DP may have substantially the same width of W10. The width W10 of the first and second active patterns APa and APb and the dummy active patterns DP may be substantially the same as or correspond to the maximum width W9 of the second spacers 51s. A width W11 of the key pattern KE may be larger than the width W10. The width W11 of the key pattern KE may be the same as or correspond to a sum of the widths of the third lower mold pattern 3c and the maximum widths W9 of a pair of the second spacers 51s.

A space L1 between each pair of the first active patterns APa may be smaller than a space L2 between each pair of the second active patterns APb. The space L1 between each pair of the first active patterns APa may be substantially equal to a space L3 between each pair of the dummy active patterns DP. The space L2 between each pair of the second active patterns APb may be the same as or correspond to the width W2 of the second photoresist patterns PP1b. The space L1 between each pair of the first active patterns APa and the space L3 between each pair of the dummy active patterns DP may be the same as or correspond to the maximum width W4 of the first spacers 41s.

Figure 14A:
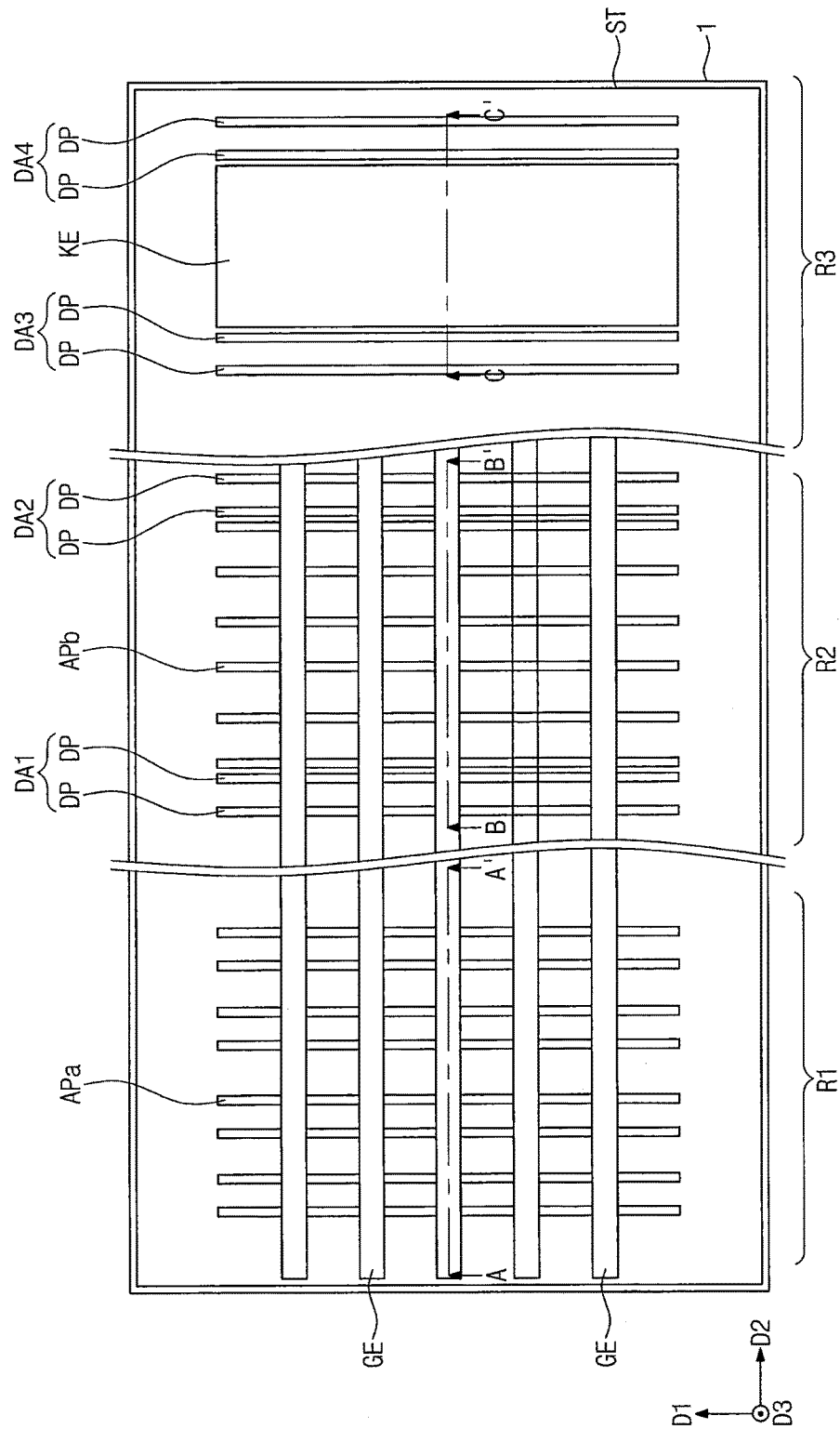
Figure 14B:
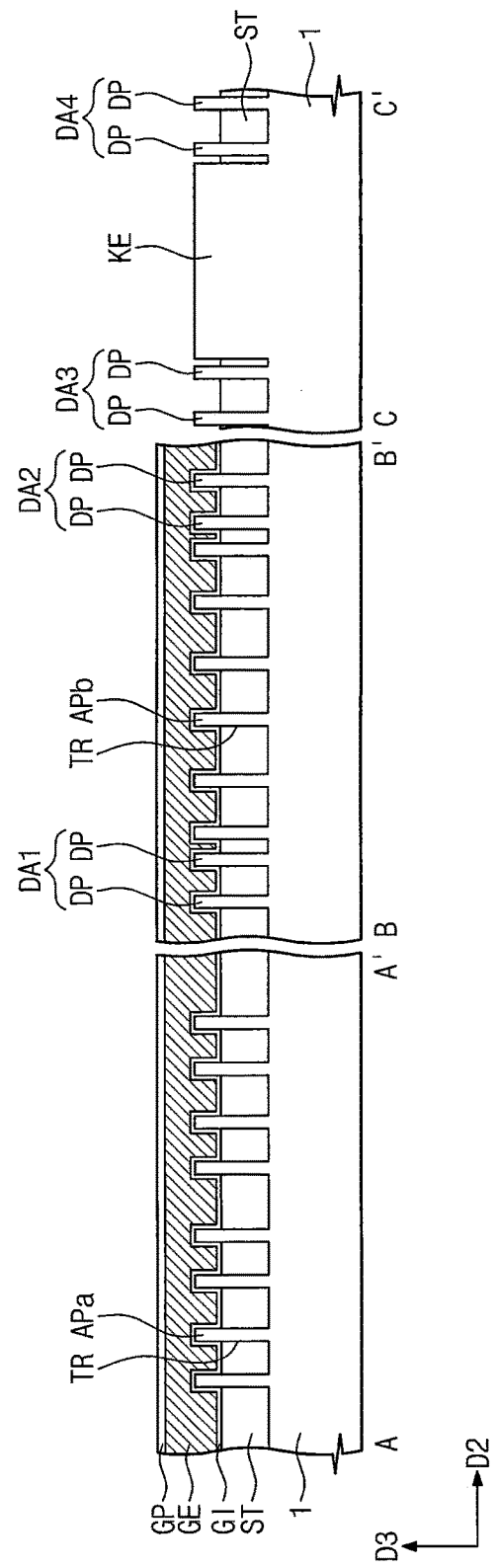

FIG. 14A is a plan view illustrating a semiconductor device according to example embodiments of the inventive concept. FIG. 14B is a sectional view illustrating vertical sections taken along lines A-A', B-B', and C-C' of FIG. 14A. Referring to FIGS. 14A and 14B, gate electrodes GE may be formed on the substrate 1 to cross the first and second active patterns APa and APb and the dummy active patterns DP or extend parallel to the second direction D2. The gate electrodes GE may be spaced apart from each other in the first direction D1. In some example embodiments, the gate electrodes GE may be selectively or locally formed on the first and second regions R1 and R2.

Gate insulating patterns GI may be respectively formed between the gate electrodes GE and the first and second active patterns APa and APb and between the gate electrodes GE and the dummy active patterns DP. Capping patterns GP may be formed on the gate electrodes GE, respectively. The formation of the gate electrode GE, the gate insulating pattern GI, and the capping pattern GP may include forming a gate insulating layer, a gate layer, and a capping layer on the substrate 1 and then performing a patterning process thereon. The gate insulating layer may include at least one of a silicon oxide layer, a silicon oxynitride layer, and/or a high-k dielectric layer of which a dielectric constant is higher than that of a silicon oxide layer. The gate layer may include at least one of doped semiconductors, metals, or conductive metal nitrides. The capping layer may include at least one of a silicon oxide layer, a silicon nitride layer, and/or a silicon oxynitride layer. The gate insulating layer, the gate layer, and the capping layer may be formed using a chemical vapor deposition (CVD) method and/or a sputtering method. In addition, although not shown, gate spacers (not shown) may be formed at both sides of each of the gate electrodes GE. For example, some embodiments provide that the gate spacers may be formed by forming a spacer layer to cover the gate electrodes GE and then anisotropically etching the spacer layer. The spacer layer may include at least one of a silicon oxide layer, a silicon nitride layer, and/or a silicon oxynitride layer.

Thereafter, although not shown, an ion implantation process may be performed on the resulting structure with the gate electrodes GE to form source/drain regions (not shown). The source/drain regions may be formed in portions of the first and second active patterns APa and APb positioned at both sides of each of the gate electrodes GE. Next, an interlayered insulating layer (not shown) may be formed on the substrate 1 to cover the gate electrodes GE. Source/drain contacts (not shown) may be formed to penetrate the interlayered insulating layer and may be connected to the source/drain regions, respectively. Further, gate contacts (not shown) may be connected to the gate electrodes GE through the interlayered insulating layer.

In some example embodiments, the key pattern KE may be used in the process of forming the gate electrodes GE, the source/drain contacts, and the gate contacts. For example, during the process, a position of the key pattern KE may be monitored or measured to form the gate electrodes GE, the source/drain contacts, and the gate contacts at their desired positions. According to the present embodiment, the key pattern KE may have a larger width (i.e., the width W11) than those of the first and second active patterns APa and APb and the dummy active patterns DP, although the key pattern KE may be formed along with the first and second active patterns APa and APb and the dummy active patterns DP. Accordingly, it is possible to prevent the key pattern KE from leaning and consequently to prevent the key pattern KE from being misread.

Further, according to some example embodiments of the inventive concept, the first and second active patterns APa and APb can be formed to have different spaces (e.g., of L1 and L2) from each other, although they are formed at the same time. In detail, the first active patterns APa may be formed by a quadruple patterning technology (QPT) process, in which the first and second spacers 41s and 51s are used. This makes it possible to form four first active patterns APa from one first upper mold pattern. By contrast, the second active patterns APb may be formed by a double patterning technology (DPT) process, in which the second spacers 51s are used. This makes it possible to form two second active patterns APb from one second upper mold pattern. This difference may result from the presence of the first etching-prevention pattern 31b, preventing the second upper mold pattern from being etched.

According to some embodiments herein, the use of the QPT process may make it possible to form the first active patterns APa with a fine pitch, on the first region R1. As an example, the first active patterns APa may be suitable for a logic cell with increasing demand for higher integration density. In the meantime, the use of the DPT process may make it possible to form the second active patterns APb, whose pitch is larger than that of the first active patterns APa, on the second region R2. Further, by using the DPT process, the space L2 between the second active patterns APb may be easily changed by changing a width of the second upper mold pattern. The second active patterns APb may be a SRAM region with a relatively low integration density, compared with the logic cell.

Still referring to FIGS. 14A and 14B, a substrate 1 with first to third regions R1-R3 may be provided. In some example embodiments, the first region R1 may be a part of a logic cell, the second region R2 may be a part of an SRAM region, and the third region R3 may be a part of a scribe lane. The substrate 1 may be a single crystalline silicon wafer or a silicon-on-insulator (SOI) wafer.

Device isolation layers ST may be provided on the substrate 1 to define first and second active patterns APa and APb, dummy active patterns DP, and a key pattern KE. For example, each of the first and second active patterns APa and APb, the dummy active patterns DP, and the key pattern KE may be shaped like a line extending parallel to a first direction D1 parallel to a top surface of the substrate 1. The device isolation layers ST may be provided to fill trenches between the first and second active patterns APa and APb, the dummy active patterns DP, and the key pattern KE and extend parallel to the first direction D1. The first and second active patterns APa and APb, the dummy active patterns DP, and the key pattern KE may be parts of the substrate 1. The device isolation layers ST may include, for example, a silicon oxide layer. Further, the device isolation layers ST may be parts of a single insulating layer; that is, they may be substantially connected to each other.

Gate electrodes GE may be provided on the first and second regions R1 and R2 to cross the first and second active patterns APa and APb and the dummy active patterns DP and extend parallel to a second direction D2 crossing the first direction D1. The gate electrodes GE may be spaced apart from each other in the first direction D1.

Gate insulating patterns GI may be provided below the gate electrodes GE, respectively, and capping patterns GP may be provided on the gate electrodes GE, respectively. Although not shown, gate spacers (not shown) may be provided at both sides of each of the gate electrodes GE. The gate electrodes GE may include at least one of doped semiconductors, metals, and/or conductive metal nitrides. The gate insulating pattern GI may include at least one of a silicon oxide layer, a silicon oxynitride layer, and/or a high-k dielectric layer of which a dielectric constant is higher than that of a silicon oxide layer. Each of the capping pattern GP and the gate spacers may include at least one of a silicon oxide layer, a silicon nitride layer, and/or a silicon oxynitride layer.

Although not shown, source/drain regions (not shown) may be provided in portions of the first and second active patterns APa and APb positioned at both sides of each of the gate electrodes GE. Further, source/drain contacts may be connected to the source/drain regions, respectively, and gate contacts (not shown) may be connected to the gate electrodes GE, respectively.

The first and second active patterns APa and APb, the dummy active patterns DP, and the key pattern KE will be described in more detail below.

In some example embodiments, the first and second active patterns APa and APb may be provided on the first and second regions R1 and R2, respectively. The first active patterns APa may serve as source/drain and channel regions of transistors constituting a logic cell. The second active patterns APb may serve as source/drain and channel regions of transistors constituting an SRAM cell. In certain cases, the dummy active patterns DP may be provided on at least one of the second and third regions R2 and R3, but they may not serve as a channel region of a transistor. The key pattern KE may be provided on the third region R3. In some example embodiments, the key pattern KE may be an overlay key provided on a scribe lane.

In detail, two pairs of the dummy active patterns DP may be provided on the second region R2. One of the two pairs of the dummy active patterns DP may constitute a first group DA1, and the other may constitute a second group DA2. Here, the second active patterns APb may be provided between the first group DA1 and the second group DA2. Further, two pairs of the dummy active patterns DP may be formed on the third region R3. One of the two pairs of the dummy active patterns DP may constitute a third group DA3, and the other may constitute a fourth group DA4. Here, the key pattern KE may be provided between the third group DA3 and the fourth group DA4.

Referring back to FIG. 13B, the first and second active patterns APa and APb and the dummy active patterns DP may have substantially the same width of W10. A width W11 of the key pattern KE may be larger than the width W10. As discussed above, the use of the wide key pattern KE makes it possible to prevent the key pattern KE from leaning and consequently to prevent the key pattern KE from being misread.

A space L1 between each pair of the first active patterns APa may be smaller than a space L2 between each pair of the second active patterns APb. In other words, an integration density of the first active patterns APa of the first region R1 may be different from that of the second active patterns APb of the second region R2. Meanwhile, the space L1 between each pair of the first active patterns APa may be substantially the same as the space L3 between each pair of the dummy active patterns DP.

Figure 15:
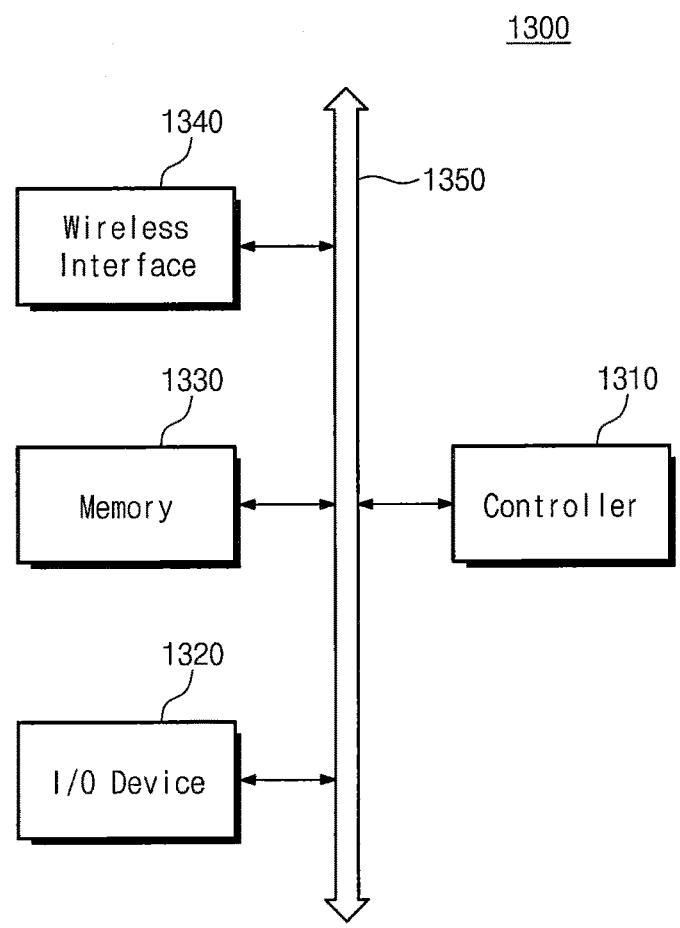
FIGS. 15 and 16 are block diagrams schematically illustrating examples of electronic devices including a semiconductor device according to some example embodiments of the inventive concept.
Figure 16:
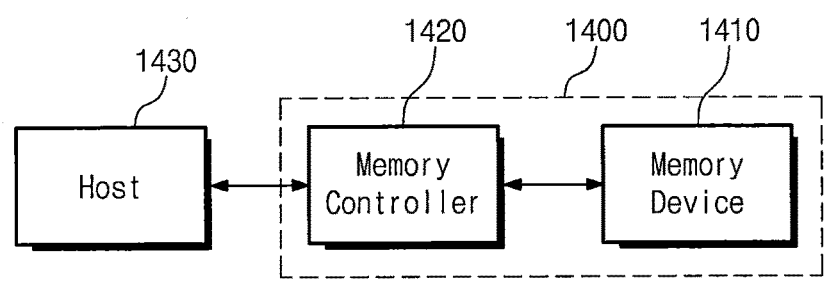

FIGS. 15 and 16 are block diagrams schematically illustrating examples of electronic devices including a semiconductor device according to some example embodiments of the inventive concept.

Referring to FIG. 15, an electronic device 1300 including a semiconductor device according to some example embodiments of the inventive concept may be one of a personal digital assistant (PDA), a laptop computer, a mobile computer, a web tablet, a wireless phone, a cell phone, a digital music player, a wired or wireless electronic device, and/or a complex electronic device including a combination of such functionalities. The electronic device 130Q may include a controller 1310, an input/output device(s) 1320 (such as a keypad, a keyboard, a display, etc.), a memory 1330, and/or a wireless interface 1340 that are connected/coupled to each other through a bus 1350. The controller 1310 may include, for example, at least one microprocessor, a digital signal processor, a microcontroller, and so forth. The memory 1330 may be configured to store a command code to be used by the controller 1310 and/or to store a user's data. The memory 1330 may include a semiconductor device according to some example embodiments of inventive concepts described herein. The electronic device 1300 may include a wireless interface 1340 configured to transmit data to and/or receive data from a wireless communication network using a RF (radio frequency) signal. For example, the wireless interface 1340 may include, for example, an antenna, a wireless transceiver, and so forth. The electronic system 1300 may be used in a communication interface protocol of a communication system according to a standard such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and/or MMDS, among others.

Referring to FIG. 16, a memory system 1400 including a semiconductor device according to some example embodiments of inventive concept will be described. The memory system 1400 may include a memory device 1410 for storing a relatively large amount of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may include the semiconductor device according to some example embodiments of the inventive concept.

The semiconductor devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and/or a wafer-level processed stack package (WSP) technique.

According to some example embodiments of the inventive concept, it is possible to simultaneously form active patterns with different spaces, on different regions of a substrate of a semiconductor device. This makes it possible to simplify a fabrication process and utilize each region of the semiconductor device with efficiency.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   sequentially forming a lower mold layer and an intermediate mold layer on a substrate with a first region and a second region;
   forming first upper mold patterns and first spacers on the intermediate mold layer, the first upper mold patterns and the first spacers being formed on the first and second regions, respectively, using different, but partially overlapping processes;
   etching the intermediate mold layer using the first upper mold patterns and the first spacers as an etch mask to form first and second intermediate mold patterns, respectively;
   forming second spacers on sidewalls of the first and second intermediate mold patterns;
   etching the lower mold layer using the second spacers as an etch mask to form lower mold patterns; and
   etching an upper portion of the substrate using the lower mold patterns as an etch mask to form active patterns.

2. The method of claim 1, wherein the first upper mold patterns have a width that is different from a maximum width of the first spacers.

3. The method of claim 2, wherein the forming of the first upper mold patterns and the first spacers comprises:
   forming first and second upper mold patterns on the intermediate mold layer to be disposed on the first and second regions, respectively;
   forming an etching-prevention pattern on at least one of the first upper mold patterns;
   forming the first spacers on sidewalls of the etching-prevention pattern and sidewalls of the second upper mold patterns; and
   removing the etching-prevention pattern and the second upper mold patterns,
   wherein the at least one of the first upper mold patterns remains after the removing of the etching-prevention pattern and the second upper mold patterns.

4. The method of claim 3,
   wherein the etching-prevention pattern is formed of a material having an etch selectivity with respect to the second upper mold patterns,
   wherein the forming of the first spacers comprises:
      forming a first spacer layer on the etching-prevention pattern and the second upper mold patterns; and
      anisotropically etching the first spacer layer to expose a top surface of the etching-prevention pattern and top surfaces of the second upper mold patterns, and
   wherein the removing of the etching-prevention pattern and the second upper mold patterns comprises:
      selectively removing the second upper mold patterns with the exposed top surfaces, while using the etching-prevention pattern to prevent the first upper mold patterns from being etched; and selectively removing the etching-prevention pattern, after the removing of the second upper mold patterns.

5. The method of claim 3,
wherein the forming of the second intermediate mold patterns comprises etching the intermediate mold layer using the first spacers positioned on both sidewalls of the etching-prevention pattern as an etch mask to form second intermediate mold patterns on the first region,
wherein some of the second spacers are on sidewalls of the second intermediate mold patterns positioned on the first region, and
wherein the active patterns comprises dummy active patterns formed using the second spacers on sidewalls of the second intermediate mold patterns positioned on the first region.

6. The method of claim 2,
wherein the forming of the lower mold patterns comprises:
removing the first and second intermediate mold patterns;
etching the lower mold layer using the second spacers on the first region as an etch mask to form first lower mold patterns; and
etching the lower mold layer using the second spacers on the second region as an etch mask to form second lower mold patterns,
wherein the forming of the active patterns comprises etching the upper portion of the substrate using the first and second lower mold patterns as an etch mask to form first and second active patterns, respectively,
wherein the first and second lower mold patterns are formed at the same time, and
wherein the first and second active patterns are formed at the same time.

7. The method of claim 2, wherein the width of each of the first upper mold patterns is substantially equal to a distance between a pair of the active patterns on the first region.

8. The method of claim 2, wherein each of the first spacers has the maximum width that is substantially equal to a distance between a pair of the active patterns on the second region.

9. The method of claim 2, wherein ones of the first upper mold patterns have the width that is larger than the maximum width of ones of the first spacers.

10. The method of claim 2, wherein the substrate further comprises a third region, and
wherein the method further comprises:
forming a third upper mold pattern on the intermediate mold layer and on the third region, the third upper mold pattern being formed at the same time as the first upper mold patterns;
etching the intermediate mold layer using the third upper mold pattern as an etch mask to form a third intermediate mold pattern;
etching the lower mold layer using the third intermediate mold pattern as an etch mask to form a third lower mold pattern; and
etching the upper portion of the substrate using the third lower mold pattern as an etch mask to form a key pattern.

11. The method of claim 10,
wherein the second spacers are formed on sidewalls of the third intermediate mold pattern, and wherein the forming of the third lower mold pattern comprises etching the lower mold layer using the third intermediate mold pattern and the second spacers as an etch mask.

12. The method of claim 2, further comprising:
forming device isolation layers to fill trenches between the active patterns; and
forming gate electrodes to cross the active patterns.

13. The method of claim 12,
wherein the trenches comprise a first trench between a pair of the active patterns on the first region and a second trench between a pair of the active patterns on the second region, and
wherein the first trench is formed to have a width larger than that of the second trench.

14. A method of fabricating a semiconductor device, comprising:
sequentially forming a lower mold layer and an intermediate mold layer on a substrate with a first region and a second region;
forming first and second upper mold patterns on the intermediate mold layer disposed on the first and second regions, respectively;
forming an etching-prevention pattern on at least one of the first upper mold patterns;
forming first spacers on sidewalls of the second upper mold patterns;
removing the etching-prevention pattern and the second upper mold patterns;
etching the intermediate mold layer using the first upper mold patterns and the first spacers as an etch mask to form first and second intermediate mold patterns, respectively;
forming second spacers on sidewalls of the first and second intermediate mold patterns;
etching the lower mold layer using the second spacers as an etch mask to form lower mold patterns; and
etching an upper portion of the substrate using the lower mold patterns as an etch mask to form active patterns.

15. The method of claim 14,
wherein the etching-prevention pattern is formed of a material having an etch selectivity with respect to the second upper mold patterns,
wherein forming the first spacers comprises:
forming a first spacer layer on the second upper mold patterns; and
anisotropically etching the first spacer layer to expose top surfaces of the second upper mold patterns, and
wherein removing the etching-prevention pattern and the second upper mold patterns comprises:
selectively removing the second upper mold patterns with the exposed top surfaces, while using the etching-prevention pattern to prevent the first upper mold patterns from being etched; and
selectively removing the etching-prevention pattern after removing the second upper mold patterns.

16. The method of claim 14, wherein the first upper mold patterns have a width that is larger than a maximum width of the first spacers.

17. A method of fabricating a semiconductor device, comprising:
sequentially forming a lower mold layer and an intermediate mold layer on a substrate with a first region and a second region;
forming a first upper mold pattern on the intermediate mold layer of the first region and a first spacer on the intermediate mold layer of the second region;

etching the intermediate mold layer using the first upper mold pattern and the first spacer as an etch mask to form a first intermediate mold pattern and a second intermediate mold pattern, respectively;

forming second spacers on sidewalls of the first and second intermediate mold patterns;

etching the lower mold layer using the second spacers as an etch mask to form lower mold patterns; and etching an upper portion of the substrate using the lower mold patterns as an etch mask to form active patterns, wherein the first upper mold pattern has a width that is different from a maximum width of the first spacer.

18. The method of claim 17, wherein the width of the first upper mold pattern is substantially equal to a distance between a pair of the active patterns on the first region.

19. The method of claim 17, wherein the maximum width of the first spacer is substantially equal to a distance between a pair of the active patterns on the second region.

20. The method of claim 17, wherein the width of the first upper mold pattern is larger than the maximum width of the first spacer.

\* \* \* \* \*